US010600823B2

(12) United States Patent
Hughes et al.

(10) Patent No.: US 10,600,823 B2
(45) Date of Patent: Mar. 24, 2020

(54) ASSEMBLY OF SEMICONDUCTOR DEVICES

(71) Applicant: Facebook Technologies, LLC, Menlo Park, CA (US)

(72) Inventors: Padraig Hughes, Cork (IE); Joseph O'Keeffe, Fermoy (IE); Celine Oyer, Cork (IE); William Henry, Cork (IE); David Massoubre, Cork (IE); Pooya Saketi, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 29 days.

(21) Appl. No.: 15/918,985

(22) Filed: Mar. 12, 2018

(65) Prior Publication Data

US 2018/0269234 A1 Sep. 20, 2018

Related U.S. Application Data

(62) Division of application No. 15/753,959, filed as application No. PCT/GB2016/052722 on Sep. 2, 2016.

(30) Foreign Application Priority Data

Sep. 2, 2015 (GB) .................................. 1515564.1
Nov. 17, 2015 (GB) .................................. 1520265.8
(Continued)

(51) Int. Cl.
*H01L 27/12* (2006.01)
*H01L 27/15* (2006.01)
*H01L 25/075* (2006.01)

(52) U.S. Cl.
CPC ...... *H01L 27/1248* (2013.01); *H01L 25/0753* (2013.01); *H01L 27/1262* (2013.01); *H01L 27/156* (2013.01)

(58) Field of Classification Search
CPC ... H01L 27/12; H01L 27/124; H01L 27/1248; H01L 27/126; H01L 27/1262; H01L 27/15; H01L 27/156
(Continued)

(56) References Cited

U.S. PATENT DOCUMENTS 7,462,897 B2 12/2008 Endo
7,545,352 B2 6/2009 Kwak et al.
(Continued)

FOREIGN PATENT DOCUMENTS

CN 102915703 B 2/2013
CN 105023522 A 11/2015
(Continued)

OTHER PUBLICATIONS

European Patent Office, European Search Report and Opinion, European Patent Application No. 18188965.0, dated Dec. 11, 2018, five pages.
(Continued)

*Primary Examiner* — Monica D Harrison
(74) *Attorney, Agent, or Firm* — Fenwick & West LLP

(57) ABSTRACT

A method for manufacturing a display element comprising a plurality of pixels, each comprising a plurality of subpixels. The method comprises undertaking, using a pick up tool, a first placement cycle (1908) comprising picking up a plurality of first, untested LED dies and placing them on a display substrate at locations corresponding to the plurality of pixels, testing (1912) the first LED emitters on the display substrate to determine one or more locations of non-functional first LED emitters, selecting one or more second tested LED dies based on a result of the test, configuring the selected one or more second LED dies to enable their pick up and placement on the display substrate and undertaking, using the PUT, a second placement cycle (2008) comprising
(Continued)

picking up the selected one or more second LED dies and placing them on the display substrate at the determined locations of the nonfunctional first LED emitters.

16 Claims, 23 Drawing Sheets

(30) Foreign Application Priority Data

Apr. 26, 2016 (GB) .................................. 1607248.0
May 27, 2016 (GB) .................................. 1609422.9

(58) Field of Classification Search
USPC ........................................................ 257/72
See application file for complete search history.

(56) References Cited

U.S. PATENT DOCUMENTS

| | | | |
|---|---|---|---|
| 7,760,165 | B2 | 7/2010 | Cok |
| 7,808,460 | B2 | 10/2010 | Nakajima |
| 7,893,610 | B2 | 2/2011 | Lee et al. |
| 8,426,227 | B1 | 4/2013 | Bibl et al. |
| 9,099,665 | B2 | 8/2015 | Suganuma et al. |
| 9,276,224 | B2 * | 3/2016 | Yamazaki ........... H01L 27/3244 |
| 9,468,050 | B1 | 10/2016 | Rotzoll et al. |
| 9,570,532 | B2 | 2/2017 | Huangfu et al. |
| 9,754,538 | B2 | 9/2017 | Lee et al. |
| 2003/0011377 | A1 | 1/2003 | Oohata et al. |
| 2005/0231459 | A1 | 10/2005 | Furukawa |
| 2005/0233504 | A1 | 10/2005 | Doi et al. |
| 2006/0022909 | A1 | 2/2006 | Kwak et al. |
| 2006/0197722 | A1 | 9/2006 | Nakajima |
| 2007/0029554 | A1 | 2/2007 | Nakamura et al. |
| 2008/0074356 | A1 | 3/2008 | Cok |
| 2008/0277677 | A1 | 11/2008 | Kuo et al. |
| 2009/0066617 | A1 | 3/2009 | Chang et al. |
| 2010/0134018 | A1 | 6/2010 | Tziony et al. |
| 2011/0149571 | A1 | 6/2011 | Lin |
| 2013/0201321 | A1 | 8/2013 | Chao et al. |
| 2014/0159067 | A1 | 6/2014 | Sakariya et al. |
| 2014/0167011 | A1 | 6/2014 | Huangfu et al. |
| 2014/0267683 | A1 | 9/2014 | Bibl et al. |
| 2014/0319486 | A1 | 10/2014 | Hong |
| 2014/0354286 | A1 | 12/2014 | Kim |
| 2014/0373898 | A1 | 12/2014 | Rogers et al. |
| 2015/0054542 | A1 | 2/2015 | Song |
| 2015/0076528 | A1 | 3/2015 | Chan et al. |
| 2015/0371585 | A1 | 12/2015 | Bower et al. |
| 2016/0005383 | A1 | 1/2016 | Lee et al. |
| 2016/0020130 | A1 | 1/2016 | Bower et al. |
| 2016/0351092 | A1 | 12/2016 | Chen et al. |
| 2017/0025075 | A1 | 1/2017 | Cok et al. |
| 2017/0047393 | A1 | 2/2017 | Bower et al. |
| 2017/0179356 | A1 | 6/2017 | Rogers et al. |
| 2017/0301296 | A1 | 10/2017 | Pappas et al. |
| 2017/0309224 | A1 | 10/2017 | Pappas et al. |
| 2017/0372677 | A1 | 12/2017 | Chang et al. |
| 2019/0181060 | A1 | 6/2019 | Pappas et al. |

FOREIGN PATENT DOCUMENTS

| | | |
|---|---|---|
| EP | 1615195 A | 1/2006 |
| JP | H08137413 | 5/1996 |
| JP | 2010/060803 | 3/2010 |
| JP | 2010/152223 | 7/2010 |
| WO | WO 2016/062835 A1 | 4/2016 |

OTHER PUBLICATIONS

GB Search Report, Intellectual Property Office Patent Application No. 1607248.0, dated Feb. 7, 2018, 1 page.
GB Examination Report, Intellectual Property Office Patent Application No. 1607248.0, dated Oct. 26, 2016, 6 pages.
International Search Report and Written Opinion, PCT Application No. PCT/GB2016/052722, dated Dec. 16, 2016, twelve pages.
Intellectual Property Office, Examination Report, GB Patent Application No. GB1515564.1, dated Feb. 20, 2019, 22 pages.
Japan Patent Office, Japanese Office Action, Japanese Patent Application No. 2018-555877, dated Apr. 2, 2019. 4 pages.
European Patent Office, European Search Report and Opinion, European Patent Application No. 17790269.9, dated Jul. 3, 2019, 13 pages.
PCT International Search Report and Written Opinion, PCT Application No. PCT/US2017/029418, dated Jul. 24, 2017, 14 pages.
United States Office Action, U.S. Appl. No. 15/351,235, dated Dec. 14, 2017, 14 pages.
United States Office Action, U.S. Appl. No. 15/753,959, dated Jul. 15, 2019 30 pages.
United States Office Action, U.S. Appl. No. 16/158,237, dated Jun. 25, 2019, 19 pages.

* cited by examiner

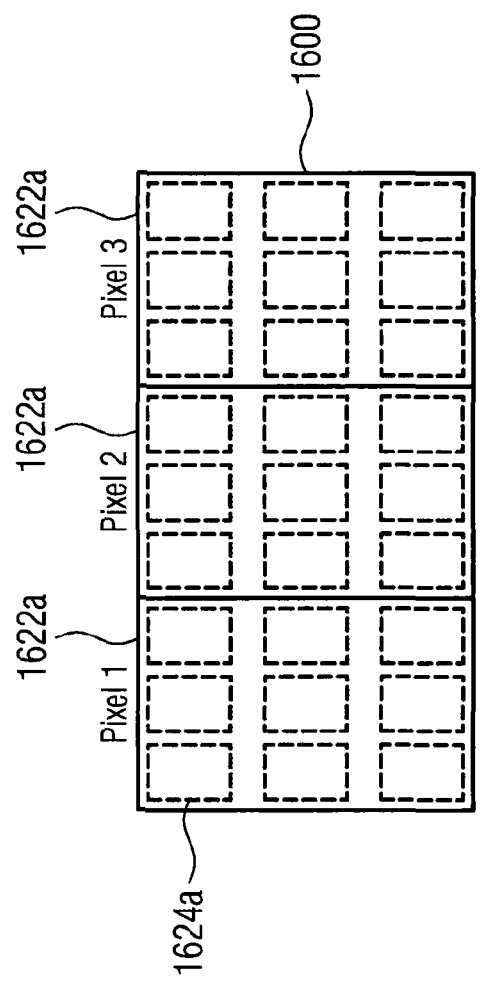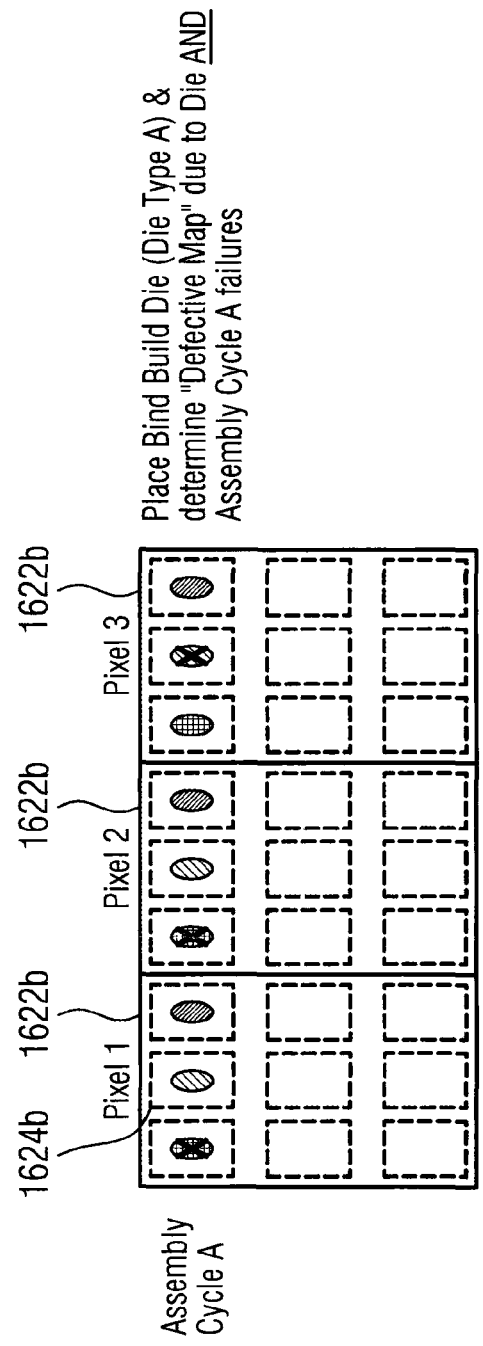
FIG 16(a)
FIG 16(b)

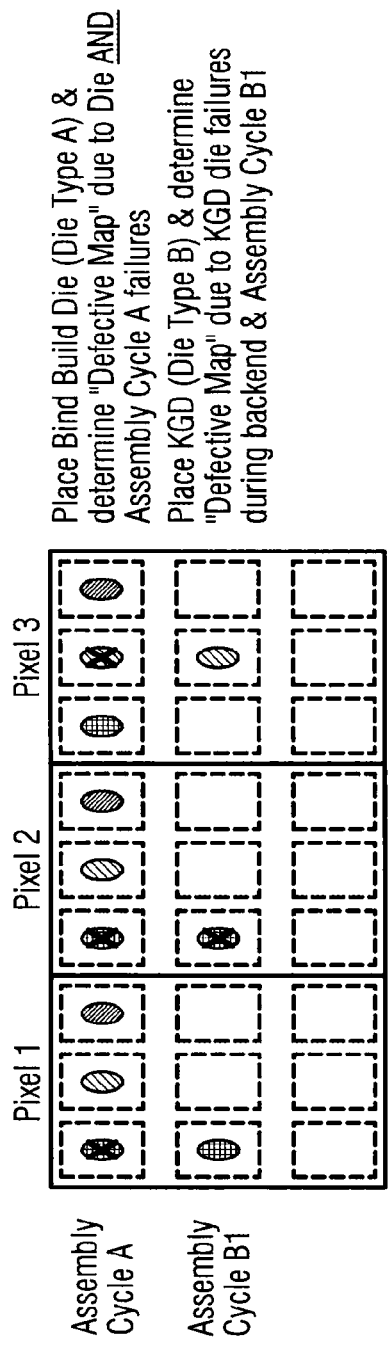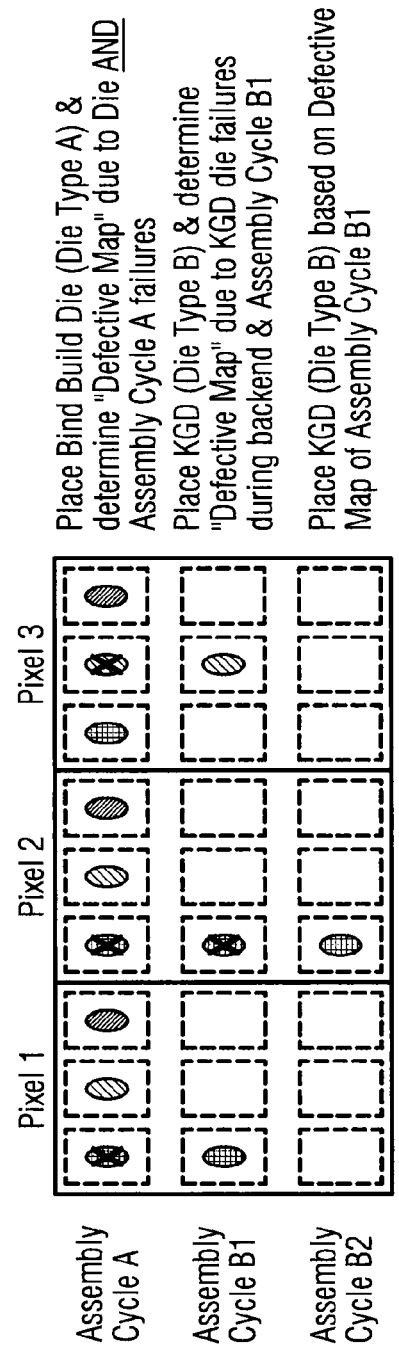

| Wafer | Single Mesa Yield | Double Mesa Yield |
|---|---|---|
| 1 | 70,7% | 78,1% |
| 2 | 75,3% | 81,7% |
| 3 | 80,3% | 85,6% |
| 4 | 85,5% | 89,7% |

Beam Profile Output from a commercial planar LED device and from µLED devices highlighting the benefit of light collimation for improved light extraction from the display stack FIG 26 Overview of eLED Assembly Process Flow (Diagrams not to scale)

Overview of eLED Assembly Process Flow (Diagrams not to scale)

Overview of eLED Assembly Process Flow (Diagrams not to scale)

ASSEMBLY OF SEMICONDUCTOR DEVICES

CROSS REFERENCE TO RELATED APPLICATIONS

This application is a divisional of U.S. patent application Ser. No. 15/753,959, filed Sep. 2, 2016, which is a National Phase application of International Application No. PCT/GB2016/052722, filed Sep. 2, 2016, which claims the benefit of United Kingdom Application No. 201515564.1, filed Sep. 2, 2015, United Kingdom Application No. 201520265.8, filed Nov. 17, 2015, United Kingdom Application No. 201607248.0, filed Apr. 26, 2016, and United Kingdom Application No. 201609422.9, filed May 27, 2016, each incorporated by reference in its entirety.

TECHNICAL FIELD

The invention relates to methods and apparatus for assembling semiconductor devices, LED dies for display technologies, displays and methods of manufacture for displays. Specifically, the invention is related to, but need not be limited to, Inorganic Light Emitting Diode (ILED), micro-LED (µLED) dies for display technologies, µLED displays and/or methods of manufacture for µLED displays. The invention may relate to methods and apparatus for assembling semiconductor devices by contact printing.

BACKGROUND

Displays are ubiquitous and are a core component of wearable devices, smart phones, tablets, laptops, desktops, TVs and display systems. Common display technologies today range from Liquid Crystal Displays (LCDs) to more recent Organic Light Emitting Diode (OLEO) Displays and Active Matrix Organic Light Emitting Diode Displays (AMOLEDs).

The display architectures include passive and active matrix displays depending on whether each pixel is driven separately or not. Active drive circuitry uses thin film transistor (TFT) technology where transistors based on amorphous silicon (A-Si), low temperature polysilicon (LTPS) and amorphous Indium Gallium Zinc Oxide (IGZO) technology are manufactured on glass panels which may have glass substrate sizes from first generation displays of around 30 cm×40 cm to the latest tenth generation displays (known as GEN10) of around 2.88 m×3.15 m.

In most portable devices (i.e. battery powered devices) the display uses a majority of the available battery power. Additionally, the most common user complaint for portable devices is insufficient display brightness. To extend battery life and improve brightness levels it is necessary to develop new display technologies that reduce power consumption and produce higher luminance emission from the light source.

Inorganic LEDs (ILEDs) are emerging as the third generation of flat display image generators based on superior battery performance and enhanced brightness. The ILED Display is at a basic level a variation of the OLED (organic LED) display. The OLED concept is based on passing current through organic or polymer materials that is sandwiched between two glass planes to produce light. The proposed ILED Display concept essentially replaces the organic LED material with a discrete standard LED (which is made of inorganic materials) at each pixel of the display (each pixel consists of three individual Red, Green and Blue LEDs for colour displays).

Standard (i.e. inorganic) LED devices have been around for many years and their performance (efficiency, brightness, reliability and lifetime) has been optimised over many years as the LED industry has pursued many commercial opportunities—especially the challenge of developing LED technology to enable it to replace the standard incandescent bulbs for general light applications, i.e. inorganic LEDs are significantly more efficient, bright and reliable than the new and less developed OLED materials.

The concept of individually switchable standard LEDs (R, G & B) at each pixel in a display is well known. This approach is in widespread use for large information displays. However, to-date it has not been possible to scale this approach down to smaller displays as standard LEDs are typically planar chips which are inefficient for light direction control. Additionally, the assembly of the many millions of pixels needed for a laptop or smart phone display is not feasible at this scale using traditional assembly manufacturing techniques.

The current challenges with ILED display manufacture are significant and assembly techniques to overcome wafer yields losses need to be factored in to the manufacturing strategy of ILED displays for today's yields and higher anticipated yields in the future. Selective pick up tools (PUTs) is one solution to overcoming yield problems where defective die are identified and replaced at source. Depending on the yield, it may not be practical or economical either to replace known bad die or to transfer only KGD from a wafer to a temporary carrier for pick to the TFT substrate. Both approaches require wafer level testing to determine KGD or defective chips on the wafer, which is complicated.

Smart assembly processes with resolutions to manipulate and handle small die improve ILED assembly on the glass panel. There is therefore a need for an assembly process with high throughput that can enable massive parallel pick and transfer of ILED dies of size <10 µm a side from the native LED wafer onto a glass TFT substrate at accuracies approx ±3 µm or less.

Smart assembly methods are being developed in the industry for ILED displays and range from "non selective" elastomer conformal stamps, laser assisted transfer, direct self-assembly methods, fluidic assembly and selective MEMs based printheads. All techniques require the preparation of assembly ready chips where the bulk of the substrate is removed or the epilayer released from the substrate. For ILED displays to become a commercial reality, many or all of the above challenges need to be solved.

SUMMARY

According to the invention in an aspect, there is provided a method for manufacturing a display element comprising a plurality of pixels, each pixel comprising a plurality of sub-pixels, each sub-pixel being configured to provide light of a given wavelength, the method comprising: undertaking, using a pick up tool, PUT, a first placement cycle comprising picking up a plurality of first, untested LED dies, each first LED die comprising at least one first LED emitter configured to provide one of the plurality of sub-pixels of the display, and placing the first LED dies on a display substrate at locations corresponding to the plurality of pixels of the display; testing the first LED emitters on the display substrate to determine one or more locations of non-functional first LED emitters; from a plurality of second, tested LED dies each comprising at least one second LED emitter configured to provide one of the plurality of sub-pixels of the display, selecting one or more second LED dies based on a result of the test; configuring the selected one or more second LED dies to enable their pick up and placement on the display substrate; and undertaking, using the PUT, a second placement cycle comprising picking up the selected one or more second LED dies and placing the selected one or more second LED dies on the display substrate at the determined locations of the non-functional first LED emitters.

Untested LED dies encompass LED dies that have not been tested on the wafer during or after fabrication. Untested LED dies may not have any test data associated with them and giving an indication of their operability, save for information relating to wafer yield, wafer material quality and/or the like. Tested LED dies encompass dies that have been tested to determine their operability. Tested LED dies may be those dies that have been tested after fabrication, perhaps on the wafer, and that have been determined to be operable. These LED dies may also be termed Known Good Dies, KGD.

It is noted that not all LED dies will be testable on the display substrate without further display fabrication steps being undertaken. For example, a vertical LED device, which has electrodes on two opposed surfaces thereof, needs further a metallisation step of the display fabrication process before it can be fully tested, e.g. for short circuit. This makes the second placement cycle much more complicated, if not impossible.

It is also noted that in exemplary methods, the non-functioning first LED dies are not replaced by the second placement cycle. Rather, in exemplary methods, the second LED dies are placed at the pixel location in addition to the non-functioning first LED dies.

Optionally, the step of configuring the selected one or more LED dies comprises depositing a deformable material on the one or more selected second LED dies.

Optionally, the deformable material is configured to cause adhesion between the one or more selected second LED dies and the PUT during the second placement cycle.

Adhesion may encompass van der Waal forces due to the deformability (or conformability) of the deformable material.

Optionally, the method the step of depositing the deformable material on the one or more selected second LED dies comprises applying the deformable material to a mould or carrier element and engaging the mould or carrier with a surface of one or more of the plurality of second LED dies so that the deformable material is in contact with the surface of the one or more of the plurality of second LED dies.

Optionally, depositing the deformable material on the one or more selected second LED dies comprises modifying a level of adhesion between the deformable material and the one or more selected second LED dies so that the deformable material adheres to the one or more selected LED dies.

Optionally, the step of modifying the level of adhesion between the deformable material and the one or more selected second LED dies comprises irradiating with light one or more portions of the mould or carrier element corresponding to locations of the one or more selected second LED dies. Optionally, the light comprises ultraviolet light.

Optionally, prior to depositing the deformable layer on the one or more selected second LED dies, the method comprises placing the selected second LED dies on a handle layer. Optionally, the selected second LED dies are adhered to the handle layer.

Optionally, the second placement cycle comprises modifying a level of adhesion between one or more of the selected second LED dies and the handle layer, such that the level of adhesion is less than a force applied by the PUT.

Optionally, the method comprises depositing a deformable material on the plurality of first LED dies, prior to undertaking the first placement cycle.

Optionally, the deformable material is configured to cause adhesion between the plurality of first LED dies and the PUT during the first placement cycle.

Optionally, the method further comprises undertaking a further test of the first LED emitters and/or the second LED emitters after the second placement cycle to determine locations of one or more non-functional first and/or second LED emitters.

Optionally, the method further comprises selecting one or more third, tested LED dies after undertaking the further test, based on a result of the further test.

Optionally, the test and/or the further test comprises applying a reverse bias to the first and/or the second LED emitters and/or applying a forward bias to the first and/or second emitters and using one or more filter(s) to analyse the emission from the first and/or second LED emitters.

Optionally, the method further comprises undertaking one or more calibration cycles of an assembled display based on the results of the test and/or the further test.

Optionally, the one or more calibration cycles comprise disconnecting one or more non-functional first and/or second LED emitters from a drive circuitry on the display substrate.

Optionally, the method further comprises depositing an underfill or non-conductive film on the substrate of the display, prior to the first and/or second placement cycles.

Optionally, the method further comprises modifying a viscosity of the underfill or non-conductive film to enable pre-bonding or bonding of the first and selected second one or more LED dies to the display substrate.

Optionally, the first and/or second LED dies comprise a bonding element arranged to permit interconnection of the first and/or second LED dies to the display substrate.

Optionally, the bonding element is configured to form a temporary contact with an electrical contact of the display substrate, thereby allowing testing of the first and/or second LED dies.

Optionally, the method comprises bonding the first and/or selected one or more second LED dies to the display substrate using a bonding head.

Optionally, the bonding head comprises a drum configured to move across the display substrate of the display and apply a force to the first and/or selected one or more second LED dies positioned thereon.

Optionally, the PUT is a non-selective PUT.

Optionally, the first and second LED dies comprise µLED dies comprising one or more respective µLED emitters.

Optionally, each µLED emitter comprises first and second electrodes configured to allow current to pass through the µLED emitter, and wherein the first and second electrodes are positioned on the same surface of the µLED die.

Optionally, the first and second electrodes are positioned on a surface of the µLED die opposite an emission surface.

Optionally, the µLED dies comprise a plurality of µLED emitters, each configured to emit light of substantially the same wavelength.

Optionally, one of the first and second electrodes is common to each of the plurality of µLED emitters.

Optionally, the method may further comprise one or more further placement cycles comprising picking up a plurality of display elements, such as passive electronics and/or drive electronics, and placing the display elements at appropriate locations for display manufacture.

According to the invention in an aspect, there is provided a computer program comprising instructions, which when executed on at least one processor, cause the at least one processor to carry out any one of the methods discussed above.

According to the invention in an aspect, there is provided a carrier containing the computer program above, wherein the carrier is one of an electronic signal, optical signal, radio signal or non-transitory computer readable storage medium.

As used herein, the term LED is considered to encompass an ILED. Further, the term LED is considered to encompass a μLED, which may also be an ILED.

It is noted that methods and apparatus disclosed herein relate to LEDs and display manufacture, although they may also relate to photodetector manufacture. In such methods, the term "LED" may be replaced with "photo-sensor". Further, other elements relating to display and/or detector manufacture, such as passive electronics and/or drive electronics, may also be placed in additional placement cycles.

Exemplary methods disclosed herein may comprise a method for assembling LEDs on the top of a non-native substrate to form an LED Display. LED displays may comprise ILEDs, which may be μLEDs. The methods disclosed herein may be tailored according to the known yield constraints appreciated by the industry from both wafer yield losses and in-assembly losses.

Exemplary methods disclosed herein may comprise a combination of non-selective and selective assembly methods using a non-conformal and/or non-selective pick-up tool.

As used herein, the term Pick up Tool (PUT) encompasses a tool containing a single pick up head or multiple pick up heads. Each head may be designed to pick at least one LED die (for example, a μLED or ILED) from a handle layer (also termed a handle carrier substrate) and place the LED die onto a final substrate, for example a display substrate such as a TFT. This may require LED dies to be manufactured in an assembly ready format. This may require the removal of the bulk substrate from the LED dies. Exemplary methods for removing the bulk substrate may include Laser Lift-off (LLO) for sapphire substrates and/or Etch Stop Layer (ESL) dry/wet etching methods for GaAs substrates.

A selective PUT may be a tool containing a single pick up head or multiple pick up heads. Each head is individually controllable such that it can be enabled or disabled to pick at least one LED die from a handle carrier substrate selectively. That is, the amount of adherence applied by a selective PUT may be altered, whereby if the pick-up head is enabled then the LED die is picked up, and if the pick-up head is disabled then the LED die is not picked up. The selective PUT may then be configured to place a picked LED die onto a final substrate such as a TFT. A selective PUT may therefore be considered to be programmable depending on the pick-up requirements and is considered an active PUT.

A non-selective PUT may be a tool containing a single pick up head or multiple pick up heads. The non-selective PUT may be configured to apply a fixed level of adherence to any given LED die. The level of adherence may not be changed. A non-selective PUT may be designed to pick according to a predetermined pattern or sequence. Each head of a non-selective PUT therefore cannot be individually enabled or disabled to pick a single LED die from a handle carrier substrate and place the LED die onto a final substrate such as a TFT. A non-selective PUT may therefore be considered as non-programmable and is considered a passive PUT.

An ILED display manufacturing approach comprises two features:
1) a spatial map across the wafer (or handle carrier substrate) of Known Good Die (KGD) from a high yielding wafer, which requires wafer level testing prior to assembly; and
2) a selective PUT to pick and place KGD.

The inventors have appreciated that for an LED (in particular an ILED) display manufacture method, the combination of KGD testing at wafer source coupled with a selective PUT is a significant challenge and not readily achieved. The wafer testing may make this approach economically impractical. Alternative strategies are desirable.

Exemplary assembly or microassembly methods may be carried out by attaching a transfer device directly to the PUT head. The transfer device may enable the selectivity necessary to pick KGD for microassembly.

The combination of the PUT and the transfer device may contact the LED die for the pick and the placement of the LED die on the TFT substrate. Examples of transfer devices may comprise conformal transfer devices and/or electrostatic transfer devices. In both cases the transfer device is removed from the element after placement.

Exemplary methods disclosed herein may have a fine resolution to manipulate and handle small dies and may achieve a high throughput. This may enable, for example, massive parallel pick and transfer of ILED dies of sizes <10 μm a side from the native LED wafer onto a glass TFT substrate at accuracies approx ±2 μm or less.

In exemplary methods disclosed herein a deformable material (forming an intermediate layer) may be deposited on a surface of one or more ILED dies, and a head of a non-conformal pick-up tool (PUT) may be used to contact the deposited deformable material. The upper surface of the intermediate layer contacts the PUT and may cause the ILED dies to adhere to the PUT head through the intermediate layer. The PUT, with a plurality of ILED dies adhered to its head, may direct the chips to a desired position over a glass or plastics thin film transistor panel substrate. Then, the upper surface of intermediate layer may be released from the PUT head so that the intermediate layer and ILED dies remain appropriately located on the receiving substrate. The PUT may be non-conformable. The intermediate layer may be deformable such that it is able to make conformal contact with the ILED dies. The intermediate layer on the ILED dies may enable selection of particular ILED dies, such as selection between defective ILED dies and KGD.

Disclosed herein are methods of LED (in particular ILED) display manufacture. The methods may lead to yield improvement based on LED emitter redundancy schemes that take into consideration realistic LED wafer starting yields. The methods may include the combination of non-selective and/or selective processes for pick and place assembly cycles.

For the remainder of this document the exemplary arrangement of μLED dies and are ILEDs is used to describe methods and apparatus for display manufacture. However, it is noted that the principles of the invention may be applied to other types of LED The methods disclosed herein may include multiple assembly cycles (e.g. pick, place & test) combined with multiple μLED dies per colour per display pixel. Each μLED die may contain multiple μLED emitters to give the same effect as a starting wafer material of high device yield, thereby giving higher display yield. It is noted that a wafer's device yield relates to the number of functional devices that a wafer may produce and can be affected by a number of factors, such as wafer quality and fabrication methods.

Display yield encompasses a measure of the number of functional LED emitters or μLED emitters in a display.

In exemplary methods, a single assembly station, or alternatively multiple assembly substations, may undertake first assembly cycle (cycle A) (e.g. pick, place & test) as follows:

- The μLED dies from a wafer containing untested μLED dies (Die Type A) may be deployed;
- The μLED dies from the wafer containing untested μLED dies may be post processed to a microassembly readiness state and may be mounted on a temporary handle layer for pick and place;
- one or more of the μLED dice may have a deformable material, which may form an intermediate transfer layer, applied thereto when mounted on the temporary handle layer;
- A transfer printing non-selective and non-conformal PUT may pick an array of μLED dies from a handle layer. The array of μLED dies may be placed on a display substrate starting, for example, at one corner, and each die corresponding to a pixel location of the display
- This sequence may be repeated with the pick location on the handle layer moving sequentially to the next (e.g. adjacent) array of μLED dies and a placement location moving to the next (e.g. adjacent) corresponding set of pixel locations on the substrate—the next square in 'a chess board pattern', by way of analogy, wherein each 'square' comprises an array of μLED dies;
- Each μLED die in each array comprises at least one μLED emitter to provide a sub-pixel of a pixel of the display;
- Once the sequence has moved through all the squares in the chess board pattern for one sub-pixel type (i.e. emission colour—RGB), the same process is repeated for the other two sub-pixel types;
- Once all sub-pixel types are completed, a test sequence may be undertaken (e.g. all μLED dies are turned on and functionally tested and it is determined which μLED dies and/or emitters in which pixel locations are not working);
- The test sequence may undertake a screening of dies using filters to tag and identify one or more die(s) that are outside the parametric performance acceptance limits of the display.
- A defect map may be recorded and programmed into the display memory for calibration during a calibration cycle (Cycle C).

In exemplary methods, a single assembly station, or alternatively multiple assembly substations may undertake a second assembly cycle (cycle B1) (e.g. pick, place & test) as follows:

- The μLED dies from a wafer containing untested μLED dies or tested μLED dies, such as KGD, (Die Type B) may be deployed;
- The μLED dies from wafer containing untested μLED dies or tested μLED dies may be post processed to a microassembly readiness state and may be mounted on a temporary handle layer for pick and place;
- The μLED dies may have a deformable material, which may form an intermediate transfer layer, applied to one or more untested or tested μLED dies when mounted on the temporary handle layer;
- The deformable material may be selectively applied to a wafer of untested or tested μLED dies according to the defect map identified during the test in of the first assembly cycle;
- A transfer printing non-selectable and non-conformal PUT may pick an array of μLED dies from a handle layer containing the untested or tested LED dies. The array of μLED dies may correspond to the pixel locations where non-functioning μLED dies are located after the first placement cycle. The array of μLED dies may be placed on a display substrate starting, for example, at one corner;
- Only μLED dies including an intermediate layer may be picked by the PUT;
- This sequence is repeated with the pick location on the handle layer moving sequentially to the next (e.g. adjacent) array of μLED dies and a placement location moving to the next (e.g. adjacent) set of locations on the substrate—the next square in 'a chess board pattern', by way of analogy;
- Once the sequence has moved through all the squares in the chess board pattern for one sub-pixel type, the same process may be repeated for the other two sub-pixel types;
- Once all sub-pixel types are completed, a test sequence may be undertaken (i.e. all μLED dies are turned on and functionally tested and it is determined which μLED dies and/or emitters in which pixel locations are not working);
- The test sequence may undertake a screening of die using filters to tag and identify die which are outside the parametric performance acceptance limits of the display.
- A defect map may be recorded and programmed into the display memory for calibration during a calibration cycle (Cycle C).

In exemplary methods, a single assembly station or an alternative assembly station may undertake a third assembly cycle (Cycle B2), which may be the same as the second assembly cycle (Cycle B1) other than the selection map for μLED pick may generated from the defective map which was determined during the second assembly cycle (Cycle B1). As many subsequent cycles may be undertaken as necessary to achieve a desired display yield.

Exemplary methods may be based on a redundancy model and not on any physical wafer repair strategy. Alternatively, redundancy strategies may comprise placement of a sister μLED sub-pixel adjacent to a defective sub-pixel. A laser trim function may be deployed to open or melt fuses to disconnect the first μLED from the driving circuit.

This physical approach to correcting defective sub-pixels while attractive may not be economical in scale when the LED wafer yields are <99%. For example a 90% wafer yield would incur ~31K laser trim functions after the first assembly cycle, which may be uneconomical. In addition, a second sub-pixel alone may be insufficient for correction unless the assembly yield for the second placement cycle is guaranteed to be 100%.

Exemplary methods may comprise a calibration cycle (Cycle C) of the final display based on the defective maps generated during the assembly sequence (cycles A, B1 and optionally B2). The calibration cycle may comprise a laser trim function to isolate from the drive circuitry defective sub-pixels that were identified in the placement cycles leaving the working μLED sub-pixels placed during the placement cycles still connected to the drive circuitry. Electrical repair strategies may be used to isolate from the drive circuitry defective μLED dies identified after the first placement cycle.

Exemplary methods may comprise one or more of the following features:

- The overall target for the μLED wafer yield may be known
- The multiple μLED dies per colour per display pixel may be sourced from different locations of the same wafer or from different wafers
- The sequence of pick, place & test may be repeated until there is a working μLED die of each colour (R, G and B) in all or nearly all (e.g. 99% or more) or all of the display pixel locations.
- The μLED dies may have all contacts on the same side, and the contacts may be placed down onto the glass, enabling the μLED emitters of each μLED die to be powered from the glass substrate immediately after placement.
- The methods may be used where the μLED wafer has not been previously tested and a defined number of μLED (single emitter or multi emitter LED) dies are placed per colour per pixel.

When a μLED die comprises multiple emitters instead of a single emitter, modelling shows that such multiple emitter dies can significantly reduce the number of cycles/dies required per pixel to obtain an acceptable display yield. This can have a significant impact on wafer material used (number of dies required) and assembly time (number of assembly cycles).

Exemplary methods of the test sequence may comprise one or more of the following features:

- Once all sub-pixel types are completed or between each sub-pixel type placement sequence, the μLED die may pre-bonded or final bond in order to carry out in-line panel testing between cycles. A pre-bond state may be a temporary metal to metal contact between the contacts of the μLED die and contact pads on the substrate of the display. This may not be a permanent bond but may be sufficient to allow testing to occur. A final bond may be where the contacts of the μLED die have undergone, for example, reflow (e.g. eutectic) or metallic interdiffusion e.g. Solid Liquid Intedifiusion (SLID) to create a permanent contact. This may involve an excitation source, such as thermal, compression or ultrasonic forces, to ensure a reliable permanent bond.
- To aid with the pick and place cycle and also the quality of the interconnection pre-applied underfills or post applied underfills may be applied to ensure a good quality reliable bonding interface. A pre-applied underfill may help with the release of the PUT from the intermediate layer and/or the contacts of the μLED die during placement.

Exemplary methods for the deposition of the deformable material to the μLED used in the first assembly cycle (Cycle A) may include one or more of the following Spin coating and lithography, spray coating, microcontact printing, lamination and micromoulding.

Exemplary methods for the deposition of the deformable material to the μLED used in the second or third assembly cycle (Cycle B1 or B2) may include one or more of the following: Inkjet processing and micromoulding.

Exemplary methods for the application of underfill to the μLED used in the first assembly cycle (Cycle A) may include one or more of the following: Spin coating and lithography, micromoulding and microprinting.

In exemplary methods an underfill may be applied during bonding. The underfill may comprise a pre-applied B-stage epoxy.

In exemplary methods a thermocompression bonding process, e.g. C2, may be used. The bonding process may use CuSn to Cu or Cu to Cu ultra-fine pitch microbump technology Exemplary methods may comprise a hybrid assembly method, which may overcome the constraints and challenges of the current technology Exemplary methods may comprise a sequence of assembly cycles. The sequence of assembly cycles may comprise non-selective and/or selective assembly cycles. The sequence of assembly cycles may comprise a wafer test and/or an in-line panel test. This approach may be enabled by LED dies disclosed herein, which may allow for in-line testing during assembly.

Methods may comprise a first placement cycle (Cycle A). The first placement cycle may part of the non-selective assembly cycle and/or may use LED dies which have not been tested, e.g. individually tested, at wafer level.

Methods may comprise a second and/or third placement cycles (Cycles B1, B2). The second and/or third placement cycles may be part of a selective assembly cycle and/or may use LED dies which have been tested e.g. individually tested.

There may be no LED wafer test before the first assembly cycle (cycle A). The first assembly cycle may only comprise picking and placing of the μLEDs. There may be a LED wafer test before the second and/or third assembly cycles (Cycles B1 and/or B2).

In exemplary methods, there may be an inline LED die test when placed on the panel between all placement cycles. The probability of each display pixel working is sufficiently high after three placement cycles of the defined number of μLED dies per pixel that it is now possible to obtain working products (displays) with a sufficiently low numbers of defects per display product that a manufacturing line repair strategy can be deployed, i.e. the display yield is sufficiently high that it is considered a 'manufacturable' process. This approach will give zero number of defects per display product for small displays, i.e. the cost increase due to multiple dies per pixel is immaterial for displays of small pixel numbers such as wearable technologies. This approach can be extended to large displays.

Subsequent μLED dies (after the first placement) may be single emitter μLED dies. This will reduce the size of the μLED dies that are used and reduce the cost.

Testing between each pick and place cycle may be used to identify defective, non-optimally performing μLED die or missing die as a result of die manufacture or assembly yields and substitute them with a working die at a redundant site located next to the defect μLED die. The working die is taken from a wafer bank of KGD which has been designated for repair work.

Optionally, a laser is used to cut the tracks for any emitter within a die that are placed but are defective and/or for excess emitters. Multiple but different numbers of LED emitters per pixel working in parallel may create image artefacts, which may not be acceptable.

A selectable PUT may also be used to repair a LED wafer or handle layer to get a 'virtual' wafer yield of 100% before submitting the wafer to the assembly processes described above. A selectable PUT may be used to 'repair' defects on a LED wafer or handle layer to produce LED wafers or handle layers having a –100% virtual yield.

In addition to an AOI approach to inspect LEDs, such as μLEDs, (functional, optical power, beam profile) an additional approach may be used, such as reverse biasing the LED and shining light onto it, i.e. getting it to act as a photodiode, and using the behaviour of the LED in photodiode mode to predict and characterise the LEDs parametric performance.

According to the invention in an aspect, there is provided a method for moving a semiconductor chip, the method comprising: contacting a pick up tool, PUT, head with a surface of a semiconductor chip at a first location, wherein the surface of the semiconductor chip comprises a deformable material configured to adhere to the PUT on contact; moving the PUT to a second location and releasing the semiconductor.

Optionally, the deformable material comprises an elastic material.

Optionally, the elastic material comprises an elastomeric material.

Optionally, the deformable material comprises a structured surface for contacting the PUT head and configured facilitate adhesion and/or release of the semiconductor chip.

Optionally, the structured surface comprises elongate pillars extending from the surface.

Optionally, the contact between the PUT head and the deformable material results in substantially no voids therebetween.

Optionally, the method further comprises depositing the deformable material on a surface of the semiconductor chip.

Optionally, the method further comprises removing the deformable material from the surface of the semiconductor chip.

Optionally, removal of the deformable material is by a process of etching. Optionally, the removal of the deformable material is by one of dissolving the deformable material or washing the deformable material away using a solution.

Optionally, the deformable material is deposited on top of a sacrificial layer deposited on the surface of the semiconductor chip, and wherein the etching process etches away the sacrificial layer.

Optionally, the PUT head is substantially rigid and/or substantially planar.

Optionally, method further comprises selectively adhering the PUT head to one or more of a plurality of semiconductor chips.

Optionally, there are a plurality of semiconductor chips, the method further comprising selectively removing the deformable material from one or more semiconductor chips before contact with the PUT head such that the PUT head does not adhere to those semiconductor chips.

Optionally, the method further comprises adhering the PUT head to a plurality of semiconductor chip.

Optionally, the semiconductor chips comprise ILED and/or µLED chips.

Optionally, the second location is a substrate of a semiconductor device.

Optionally, the substrate comprises a glass or plastics thin film transistor panel.

Optionally, the method further comprises arranging a plurality of ILED and/or µLED chips on the substrate to form an image generator of a display.

According to the invention in another aspect, there is provided a method for forming an image generator of an LED display, the method comprising: depositing a deformable material on a surface of a plurality of ILED and/or µLED chips; contacting a pick up tool, PUT, head with the deformable material deposited on one or more of the plurality of ILED and/or µLED chips, such that the one or more of the plurality of ILED and/or µLED chips adheres to the PUT head; moving the PUT head such that the one or more ILED and/or µLED chips are positioned such that contacts of the one or more ILED and/or µLED chips are in electrical communication with pads of thin film transistors of a glass or plastics thin film transistor panel; and releasing the one or more ILED and/or µLED chips from the PUT head.

According to the invention in another aspect, there is provided an image generator for an LED display, comprising: a plurality of ILED and µLED chips arranged on a glass or plastics thin film transistor panel, wherein the one or more ILED and/or µLED chips have been arranged on the glass or plastics thin film transistor panel by: depositing a deformable material on a surface of the plurality of ILED and/or µLED chips; contacting a pick up tool, PUT, head with the deformable material deposited on one or more of the plurality of ILED and/or µLED chips, such that the one or more of the plurality of ILED and/or µLED chips adheres to the PUT head; moving the PUT head such that the one or more ILED and/or µLED chips are positioned such that contacts of the one or more ILED and/or µLED chips are in electrical communication with pads of thin film transistors of a glass or plastics thin film transistor panel; and releasing the one or more ILED and/or µLED chips from the PUT head.

According to the invention in another aspect, there is provided a method for moving a semiconductor chip, the method comprising: contacting a pick up tool, PUT, head with a surface of a semiconductor chip at a first location, wherein the surface of the semiconductor chip comprises an intermediate layer that is conformal and results in a conformal surface contact between the surface of the intermediate layer and the PUT head.

BRIEF DESCRIPTION OF THE DRAWINGS

FIGS. 16(a) to 16(d) are schematic views of part of an exemplary display;

DETAILED DESCRIPTION

Figure 1:
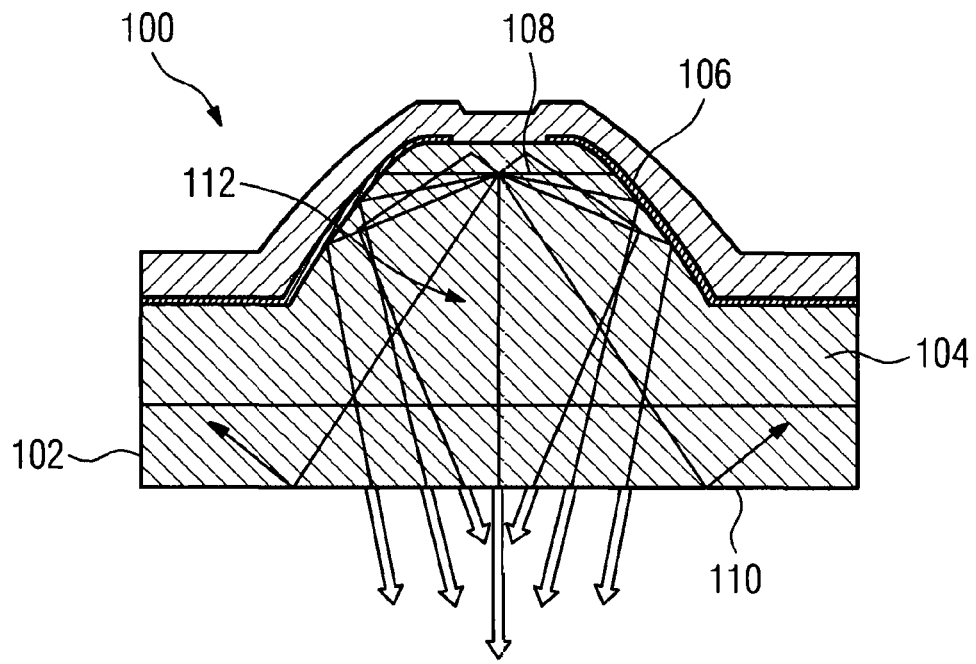
FIG. 1 is a schematic cross section of a µLED.

The inventors have appreciated that ILED Displays may provide future generations of flat display image generators providing superior battery performance and enhanced brightness. The ILED Display is at a basic level a variation of the OLEO display. The OLEO concept is based on passing current through organic or polymer materials that are sandwiched between two glass planes to produce light.

ILED display manufacture refers to the assembly of semiconductor inorganic light emitting diode (ILED) or other microLED devices onto flexible substrates or substrates such as TFT glass substrates. The assembly of millions of small μLEDs chips to create an ILED display can create unique challenges, for example, when considering wafer and assembly yield losses and the test strategy during in-line assembly onto non-native substrates.

The inventors have further appreciated some challenges with ILED display manufacture, as set out below.

High LED wafer yields greater than or equal to 99.99% are ideally preferred for ILED display manufacture because the display industry takes a zero tolerance approach to pixel defects in a display. State of the art LED wafer manufacturing yields vary in the industry considerably depending on the product. A wafer yield >99.9% is considered unrealistic and is one of the primary obstacles to ILED Display manufacture given that the pixel count in displays range from 10 s of thousands for wearable displays to 10s of millions for large area high resolution displays. Alternative strategies are needed which take into consideration existing wafer yield scenarios.

The dimensions of LED dies required for ILED Displays are significantly smaller in scale compared to standard LED dies for traditional luminaire/lighting applications. The means that traditional assembly methods are not compatible with these chips sizes and therefore finer placement solutions are needed. Specifically, smart assembly processes with resolutions to manipulate and handle small die improve ILED assembly on the glass panel. There is therefore a need for an assembly process with high throughput that can enable massive parallel pick and transfer of ILED dies of size <10 μm a side from the native LED wafer onto a glass TFT substrate at accuracies approximately below ±2 μm or less.

Strategies for assembly include wafer repair where known bad die are replaced on the wafer with KGD die or the transfer of only KGD from the wafer to a temporary carrier for pick to the TFT substrate. Both approaches require complicated wafer probe card testing to determine KGD to generate a defect map on the wafer. These are considered uneconomical and redundant by the methods disclosed herein. Depending on the wafer yield, it may also not be practical or economical to either replace known bad die or transfer only KGD from a wafer to a temporary carrier for pick to the TFT substrate Smart assembly methods are being developed in the industry for ILED displays and range from "non-selective" elastomer conformal stamps, laser assisted transfer, direct self-assembly methods, fluidic assembly and selective MEMs based print heads. All techniques require the preparation of assembly ready chips where the bulk of the substrate is removed or the epilayer released from the substrate.

Non-selective pick and place assembly methods may only practical for small display sizes and where die and assembly yields after a first pick and place on the display are greater than 99.99%. As an example, a wearable 320×320 pixel display format consists of 307,200 subpixels with 102,400 subpixels of each primary colour red, green. A yield of >99.99% results in 308 defective pixels which require replacement and repair. Replacement and repair strategies at these numbers can be time consuming and not economical for a wearable cost of goods. Alternative lower cost methods are needed.

Selective pick and place assembly may be a preferred solution in overcoming yields problems where the PUT only selects known good die (KGD) for assembly. This requires full wafer test capability where defective die are identified and a defective wafer map is established.

The inventors have appreciated that for ILED Displays to become a commercial reality, all of the above challenges may need to be solved. A manufacturing methodology is disclosed herein, which may address the specific needs of the ILED display industry and may overcome one or more shortfalls in existing technologies, such as low wafer yields, complicated wafer test methods and/or selective PUT tool design. Exemplary methods and apparatus disclosed herein may comprise a redundancy scheme. Exemplary methods and apparatus disclosed herein may use micro LEDs (μLEDs) for implementation in display, which may include displays ranging from wearable displays to larger laptop displays.

Generally, disclosed herein is a method for manufacture of displays. Exemplary displays may be used in display applications, such as a wearable display incorporating μLEDs.

As used herein, "μLED" technology encompasses micron size ILED devices that directionalise the light output and maximise the brightness level observed by the user. The μLED is disclosed in U.S. Pat. No. 7,518,149 and is a next generation ILED technology developed specifically to deliver directionalised light. As used herein, "directionalised light" encompasses collimated and quasi-collimated light. For example, directionalised light may be light that is emitted from a light generating region of an ILED and at least a portion of the emitted light is directed into a beam having a half angle. This may increase the brightness of the ILED in the direction of the beam of light.

A μLED may have a circular cross section, in which case a diameter of the μLED is typically less 20 μm. A μLED may have a parabolic structure etched directly onto the ILED die during the wafer processing steps. The parabolic structure may comprise a light emitting region of the μLED and reflects a portion of the generated light to form a quasi-collimated light beam emerging from the chip.

FIG. 1 shows an exemplary μLED 100. The μLED 100 shown in Figure is the same or similar to that proposed in WO2004/097947 (also published as U.S. Pat. No. 7,518, 149) having a high extraction efficiency and outputting quasi-collimated light because of the parabolic shape. A substrate 102 has a semiconductor epitaxial layer 104 located on it. The epitaxial layer 104 is shaped into a mesa 106. An active (or light emitting) layer 108 is enclosed in the mesa structure 106. The mesa 106 has a truncated top, on a side opposed to a light transmitting or emitting face 110 of the μLED 100. The mesa 106 also has a near-parabolic shape to form a reflective enclosure for light generated within the μLED 100. The arrows 112 show how light emitted from the active layer 108 is reflected off the internal walls of the mesa 106 toward the light exiting surface 110 at an angle sufficient for it to escape the μLED device 100 (i.e. within an angle of total internal reflection).

The parabolic shaped structure of the μLED 100 results in a significant increase in the extraction efficiency of the μLED 100 into low illumination angles when compared to unshaped or standard LEDs.

Figure 2:
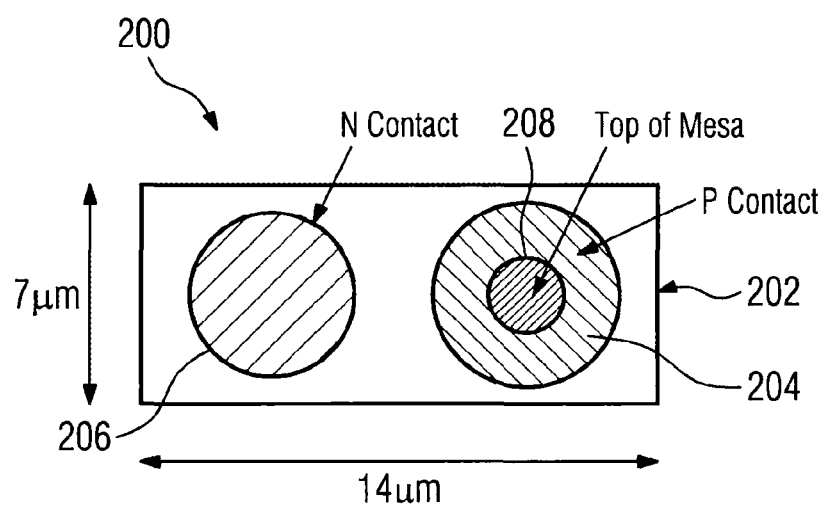
FIG. 2 is a schematic view of an exemplary µLED die.

FIG. 2 shows an exemplary μLED die 200. The die 200 comprises a single emitter 202 with a "p" electrode 204 and an "n" electrode 206 formed on the same side of the die 200 as a mesa 208. The light is output from a light emitting surface 210 on the opposite side of the μLED die 200 to the electrodes. The light is emitted through the epitaxial layer of the μLED die 200.

Figure 3:
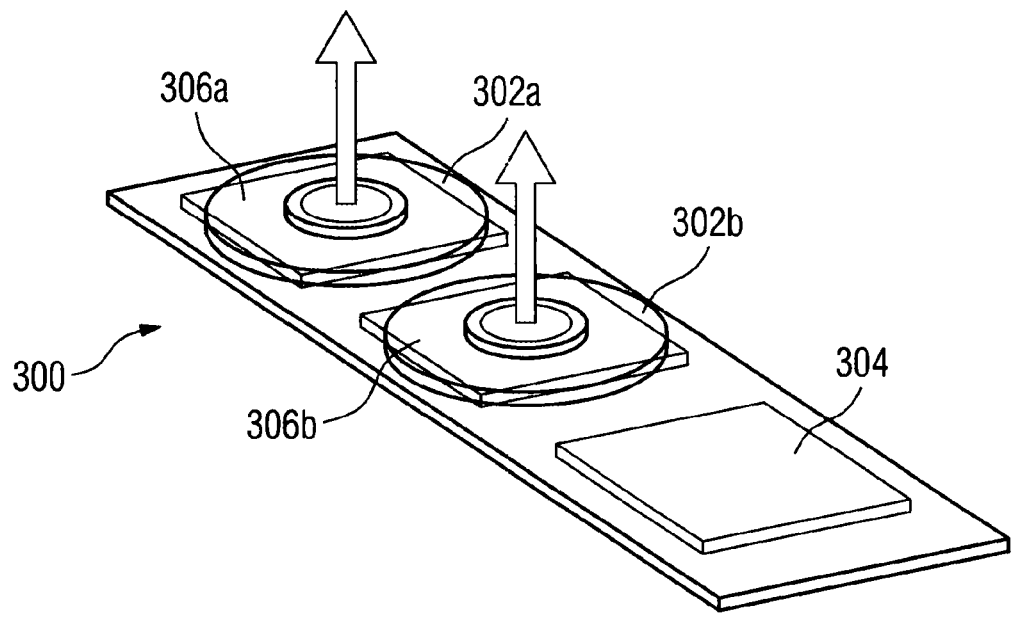
FIG. 3 is a schematic view of an exemplary µLED die.

FIG. 3 shows a perspective view of a μLED die 300 comprising a plurality of emitters 302a, 302b. The single die 300 of FIG. 3 comprises two μLEDs. As used herein, the term "single die" encompasses a single and discrete section of substrate, e.g. a semiconductor substrate, on which semiconductor devices are fabricated. The die 300 comprises an n electrode 304 and a p electrode 306a, 306b for each μLED emitter 302a, 302b.

The size of the μLED die 300 is larger than the die 200 shown in FIG. 3, as the number of μLED emitters is increased. However, in the case where multiple emitters are required and the n and p electrode formations are on the same side of the chip, the real estate used by the die 300 is reduced. For example, if two emitters are required, the die 300 represents a real estate saving in excess of 25% compared to two dies 200, which comprise a single emitter.

An advantage of apparatus disclosed herein is the interconnect configuration of the dies (i.e. p and n electrodes on an opposite side to the light emitting side). This configuration allows integrated testing of the dies 300 immediately after assembly onto a glass (or other transparent material) panel and before completion of a final display stack assembly. The manufacturing test strategy is therefore simplified and testing can be integrated into the assembly process. It will be appreciated that the interconnect configuration may also permit a simplified die repair or replacement strategy, which may be integrated into the assembly process.

Figure 4:
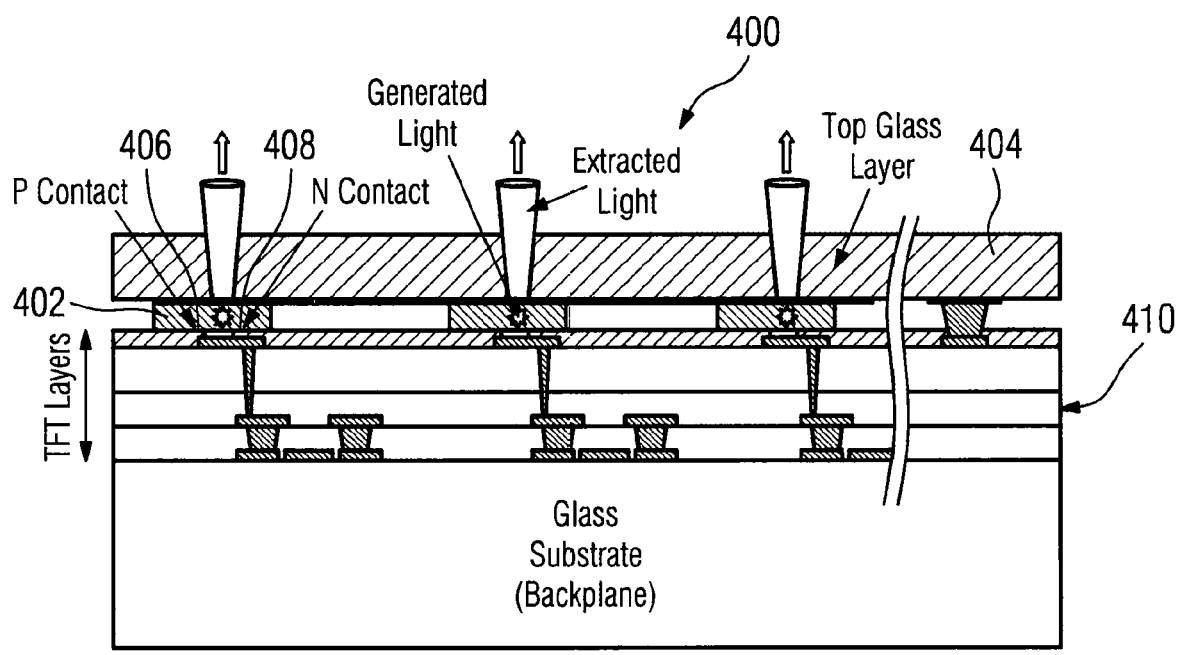
FIG. 4 is a section through an exemplary display.

FIG. 4 is a cross section through a section of a display 400. The display 400 comprises a plurality of μLED dies 402 mounted on a glass top layer 404 such that emission of light is into and through the glass top layer 404. In the exemplary configuration of FIG. 4, both the p and n electrodes 406, 408 are mounted on the same side of each die 402 and on an opposite face of the die 402 to the output face. FIG. 4 shows how the μLED dies 402 may be mounted on TFT layers 410 of the display 400.

The p and n electrodes 406, 408 are on a lower surface of the dies 402 facing down and in direct contact with display active circuitry in the TFT layers 410 using suitable bonding layers. Further, the display comprises no patterned bank structures that, in other displays are necessary to form conductive tracks and reflective layers to directionalise light upwards towards the top glass layer 404. The display 400 comprises a plurality of μLED dies 402 that inherently directionalise light output so reflective bank layers are not necessary. In other arrangements, the contacts of the μLED dies 402 may be formed on opposite sides of the die. This restricts final testing until topside passivation and full electrical interconnections are made. In exemplary methods and apparatus disclosed herein, the two contacts 406, 408 are facing down onto the TFT layers 410, which enables testing prior to any final passivation in the display final assembly.

Figure 5:
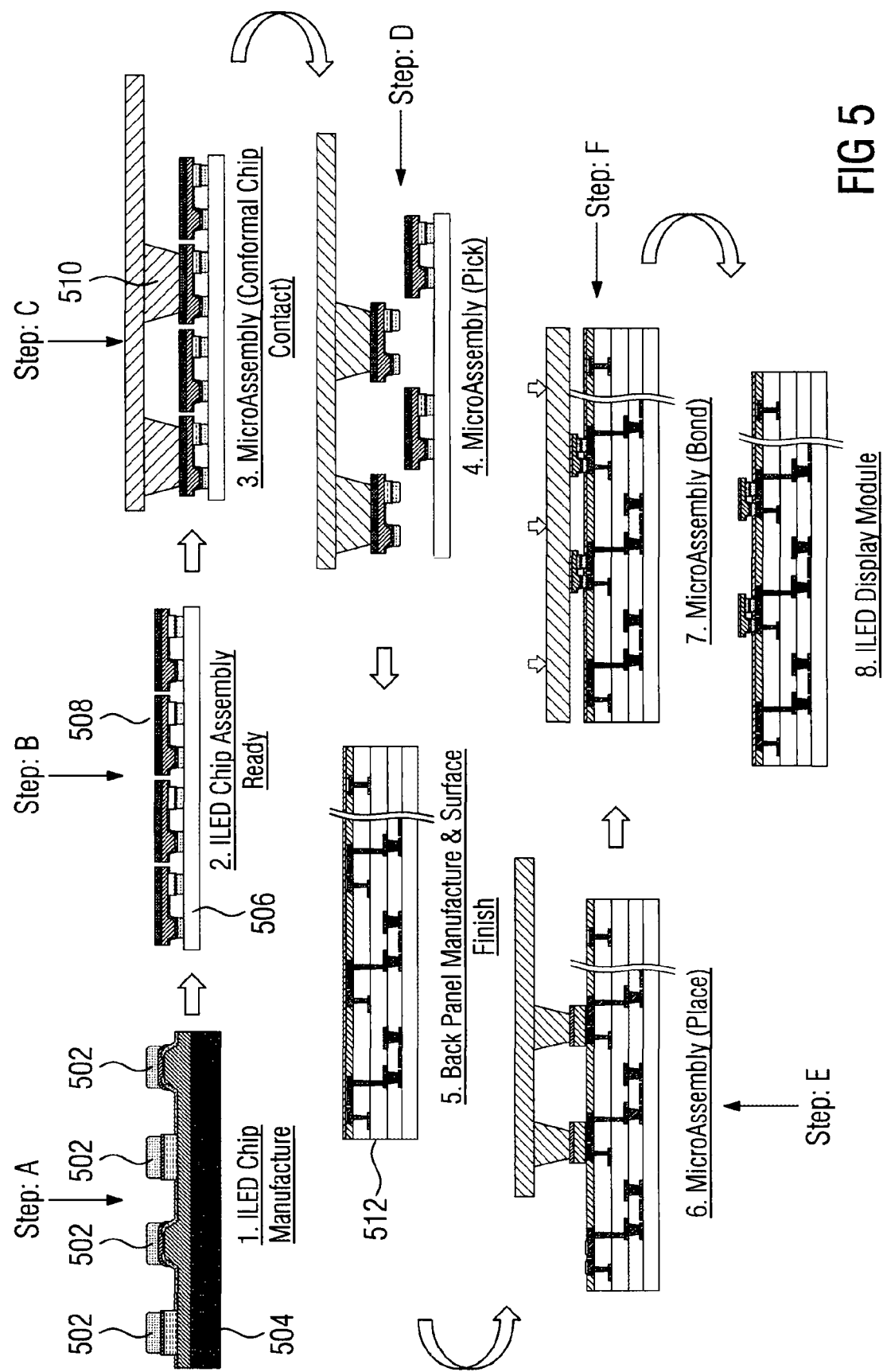
FIG. 5 is a schematic view an exemplary display manufacturing method.

By way of example, FIG. 5 illustrates a process flow for manufacturing the display 400 shown in FIG. 4. The initial step (A) in the process is the manufacture of the μLED device 502. After the μLED fabrication, the devices 502 are removed from their epitaxial substrate 504. A mechanical layer is applied to the top surface of the devices 502, which acts as a handle layer 506 for subsequent processing steps. After transferring the devices 502 on to the handle layer 506, a conformal intermediate layer 508 is deposited on to a top surface of the devices 502 and the devices 502 are partially singulated, as shown in step B of FIG. 5. The transfer head 510 of a PUT is a flat non-elastomeric head, which when applied to the intermediate layer results in conformal contact between the intermediate layer 508 and the transfer head 510 of the PUT (step D). This enables the devices 502 to be picked up and transferred to a display substrate 512 (or TFT layer) (step E). The transfer head 510 may be made from plastic, glass or silicon with a dimple protruding for each chip 502 to be picked up. Once the devices 502 are placed on the TFT layer 512, the transfer head 510 of the PUT can be removed from the intermediate layer 508. After placement of the devices 502 on the TFT layer, the intermediate layer 508 may be removed and the devices can be bonded to the TFT layer (step F). It should be understood that the methods disclosed herein are not restricted to the process flow described above and/or shown in FIG. 5.

The steps of the exemplary process flow of FIG. 5 will be described in more detail below.

Figure 6:
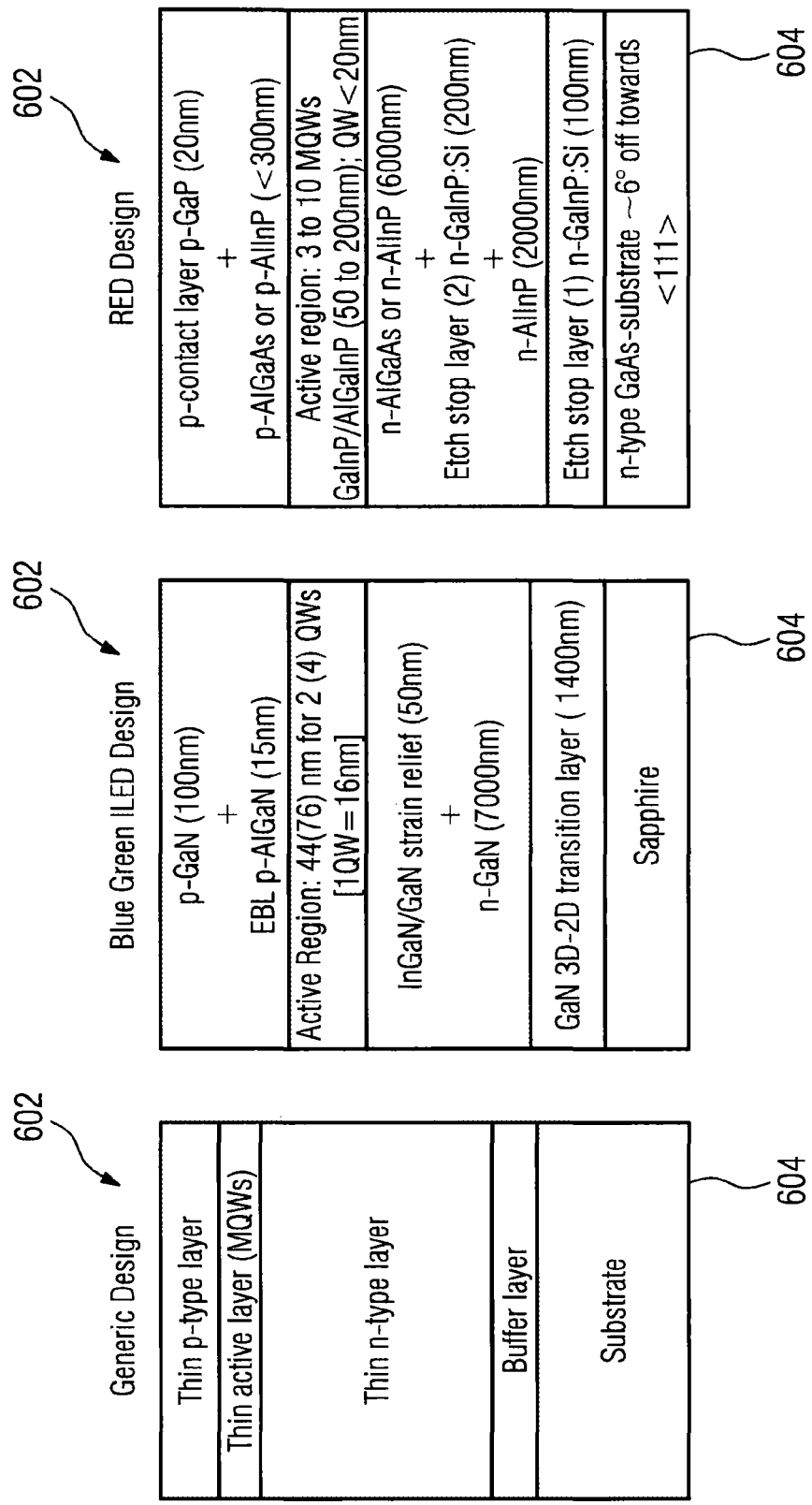
FIG. 6 is a schematic view of an exemplary µLED die design.

FIG. 6 shows exemplary structures of the μLED devices 602. As can be seen in FIG. 6, μLED devices for blue (e.g. λ=470 nm) and green (e.g. λ=530 nm) light emission are based on a GaN on sapphire 604 material system. Exemplary blue and green device 602 can include a multi quantum well structure (MQWs) as their active layer. In this example, the active layer is provided between p-type and n-type GaN layers. It will be appreciated that the device 602 may include one or more strain relieving layers.

Exemplary μLED devices for red (e.g. λ=640 nm) light emission can include Phosphide- or Arsenic-based epitaxial layers on a GaAs substrate 604. The active layer for the red device can also include a MQWs, which in this example is based on Phosphide-containing heterostructures. It will be appreciated that in other examples, the MQWs may include one or more Arsenic-based heterostructures. The red devices can include one or more etch stop layers (ESL), which may be deposited in the GaAs substrate 604. It should be appreciated that the methods disclosed herein are not restricted to these materials or this device structure or those shown in FIG. 6.

Figure 7:
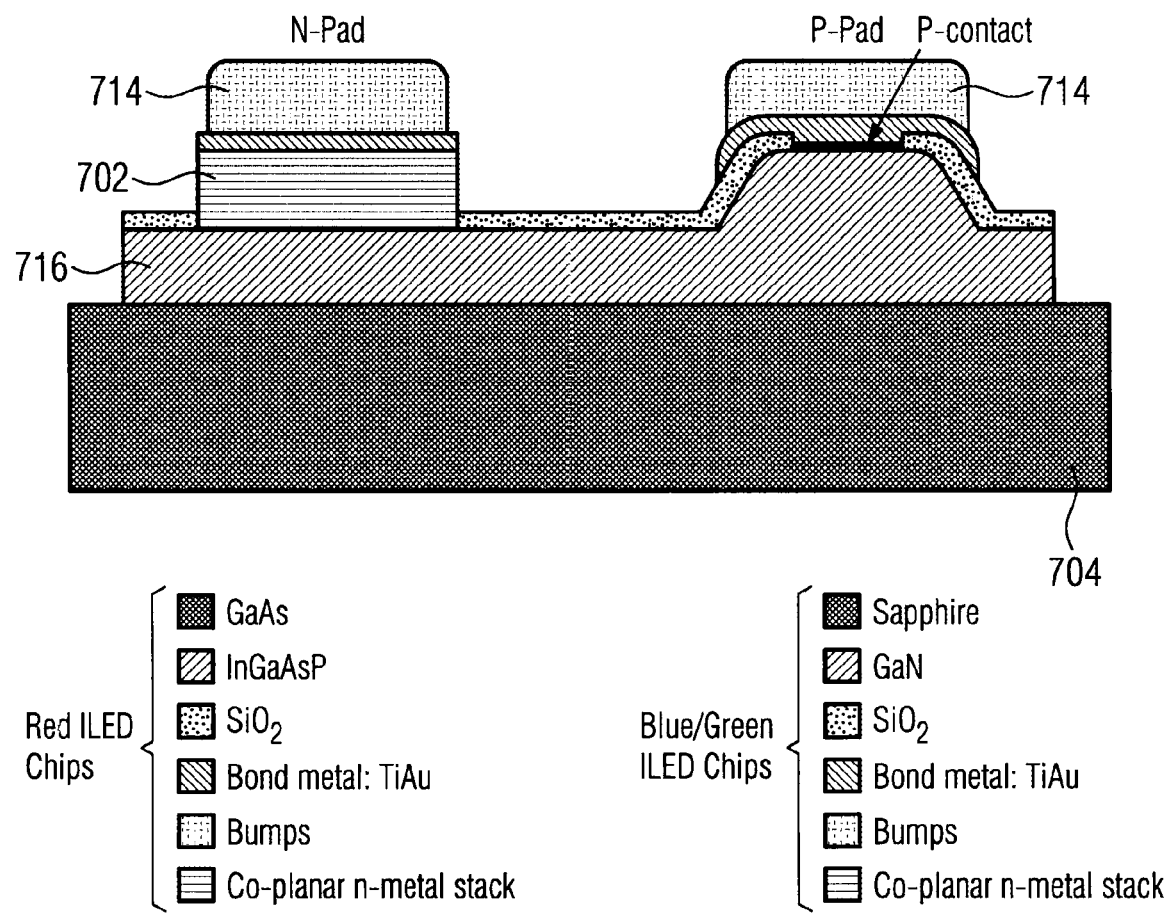
FIG. 7 is a schematic cross section of an exemplary µLED.

FIG. 7 shows a cross section through an exemplary μLED device 702 (or ILED die) on the substrate 704, which can be a sapphire substrate for green and blue light emitting devices and GaAs substrate for red light emitting devices. The exemplary device 702 shown in FIG. 7 is similar to those shown in FIGS. 1, 2 and 3. The device 702 of FIG. 7 includes a bonding element, which is provided in the form of a bump or microbump 714, for interconnection of the devices 702 to the TFT layer. The bump 714 is arranged on the top surface of the devices 702 and above a contact pad. The contact pad includes the p- and n-contacts of the devices, which arranged on a single side of the devices opposite to the chip 702 emission side and has a diameter of about 5 µm. The bump 714 can have a height of about 3 to 6 µm and include a metal, e.g. CuSn or Cu, to permit interconnection to corresponding metal pads, e.g. Cu pads, on the TFT layer. Once the devices 702 have been transferred on to the TFT layer, the bumps 714 on the devices 702 are in temporary metal to metal contact, which allows testing of the devices 702. To test the devices 702, the devices 702 may not be permanently bond to the TFT layer. The temporary metal to metal contact between the bumps 714 and the metal pads on the TFT layer may permit testing of the devices 702 in a pre-bond state, i.e. temporary bond state. The bumps 714 on the devices 702 may allow for a high throughput multi-device to panel interconnection and bonding. Known C4 (controlled collapse chip connection) flip-chip technology cannot scale down to a target interconnect pitch due to bumps collapsing during bonding. The collapse of the bumps may cause bridging between the bumps which may be 10 µm pitch or less.

Figure 8:
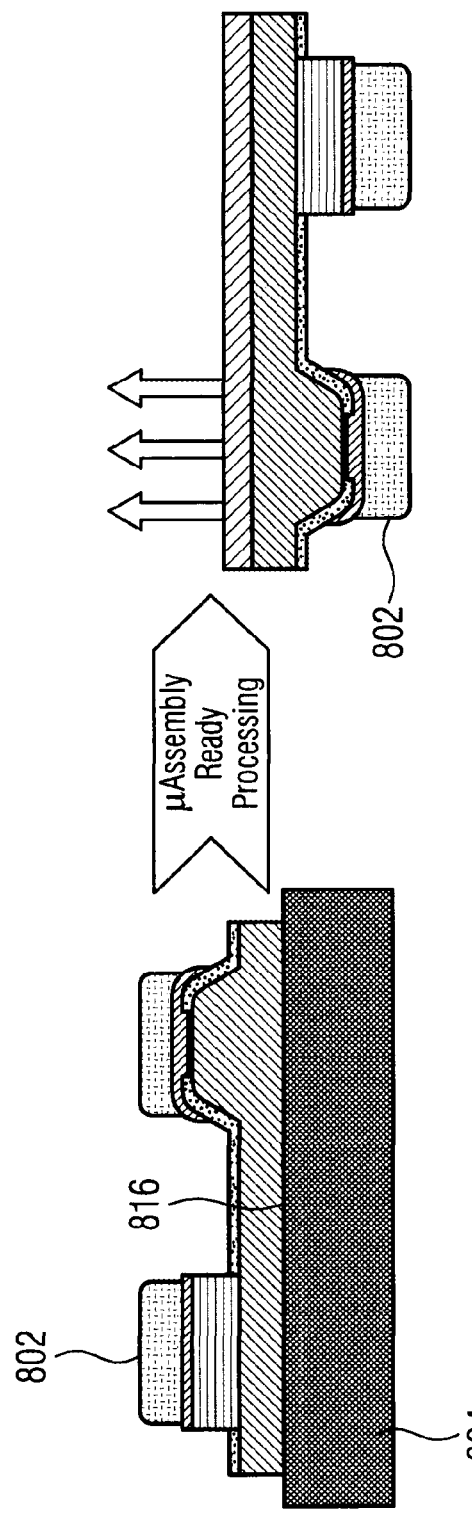
FIG. 8(a) is a schematic cross section of an exemplary µLED.
FIG. 8(b) is a schematic cross section of an exemplary µLED after substrate removal.

The exemplary µLED device 802 shown in FIG. 8(a) is similar to that shown in FIG. 7. The device 802 may have a length below 20 µm, a width below 10 µm and a thickness of about 3 to 8 µm. The emitting surface 816 may have a roughness of less than 200 nm. These properties/dimensions of the device 802 may be beneficial for assembly of the devices 802 on the TFT layer. However, it should be understood that the methods and apparatus disclosed herein are not restricted to µLED device having these properties/dimensions.

FIG. 8(b) shows two exemplary µLED devices 802, which are similar to that shown in FIGS. 7 and 8(a). In FIG. 8(b), the devices 802 have been removed from the substrate 804. Once the substrate 804 is detached from the devices 802, the devices 802 are inverted and can be further processed.

Removal of the substrate 904 from the devices 902 will be described in more detail below with reference to FIG. 9.

Figure 9:
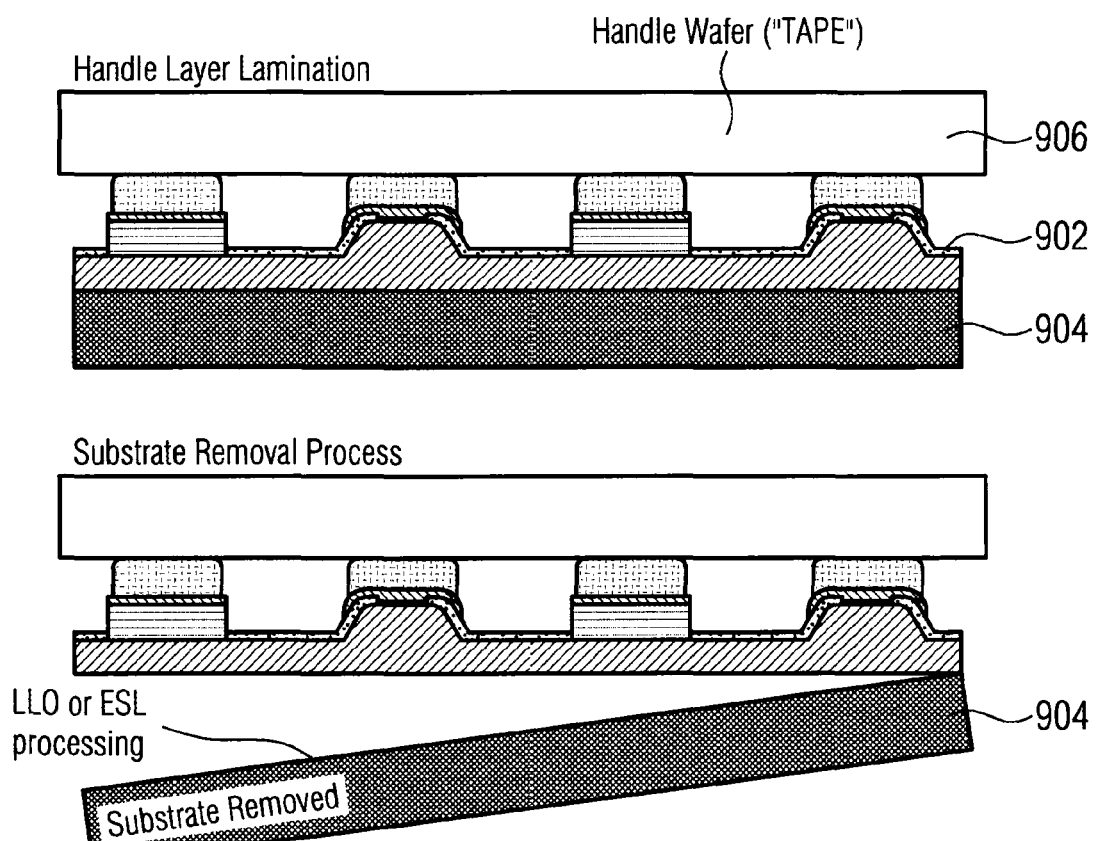
FIG. 9 is a schematic view of an exemplary substrate removal process.

FIG. 9 shows an exemplary substrate removal process. Exemplary methods for substrate removal may include chemical etching and thinning of the substrate 904. Before the substrate 904 is removed, the handle layer 906 is applied to the top surface of the devices 902. One or more tape(s), such as one or more UV tape(s) (not shown), can be used to attached the devices 902 to the handle layer 906, The adhesion strength of the devices 902 to the handle layer 906 can be modified by irradiating the UV tapes with UV light. Other examples of tapes that can be used instead of the UV tape include thermal release tape, whose adhesion strength can be modified by exposing the tape to heat.

Once the handle layer 906 is applied a laser lift-off (LLO) process can be applied to the devices 902, which include a sapphire substrate. The laser lift-off process removes the sapphire substrate using a laser beam, such as a UV laser beam. The laser beam is directed through the sapphire substrate to the GaN layer of the devices 902 and creates a shockwave at the interface between the GaN layer and the sapphire substrate, thereby disassociating the GaN from the sapphire. The process can create free-standing GaN layers having a thickness of less than 10 µm. The technology is of interest for high throughput and superior quality in the manufacture of high power LED chips or Nitride semiconductors grown on sapphire substrate, such as InGaN or GaN.

Figure 10:
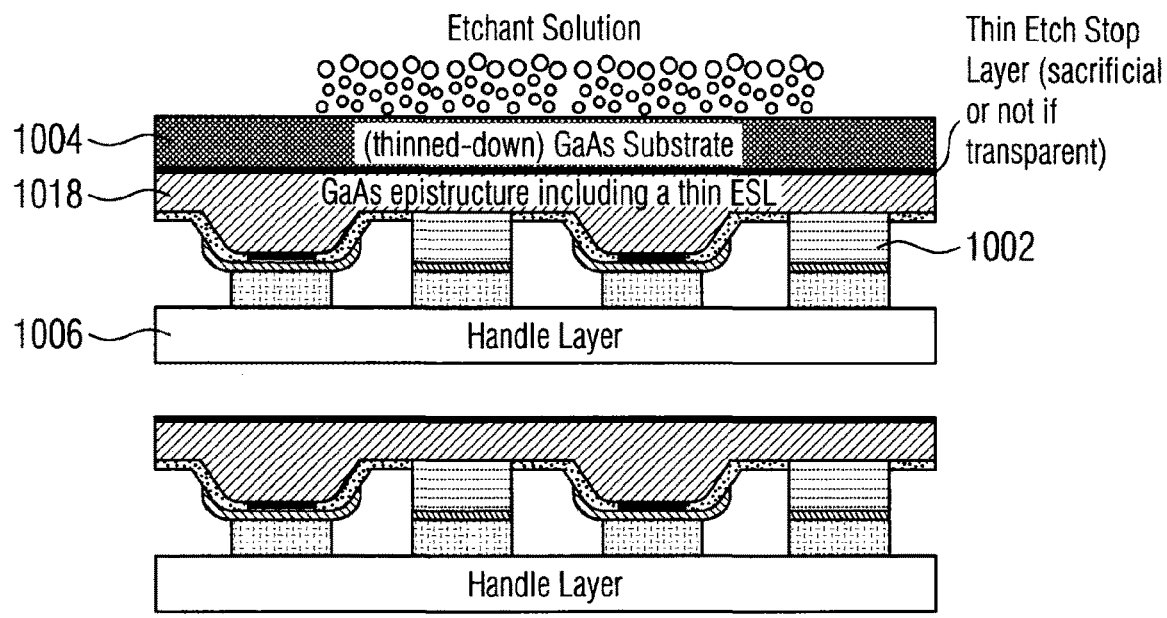
FIG. 10 is a schematic view of an exemplary substrate removal process.

FIG. 10 shows an exemplary process for the removal of a GaAs substrate from red µLED devices 1002. As described above, the red devices can include one or more etch stop layers (ESL), which are deposited on the GaAs substrate 1004 and separates the GaAs substrate 1004 from the epitaxial layers 1018 of the devices 1002. By way of example, the ESL can be formed by a single high Al-composition AlGaAs layer or an InGaP layer. In some examples two ESLs may be used to reduce the surface roughness Depending of the application, the ESL may be kept or removed by selective dry and/or wet etching. In some exemplary processes, the GaAs substrate 1004 is thinned prior to selective wet/dry etching of the substrate 1004. This may accelerate the removal of the substrate 1004. In exemplary processes, the GaAs substrate 1004 is selectively removed by using organic acid-based (e.g. citric acid) or NH40H-based wet etchant, while the ESL can be selectively removed by HCl-based or HF-based wet etchant.

Figure 11:
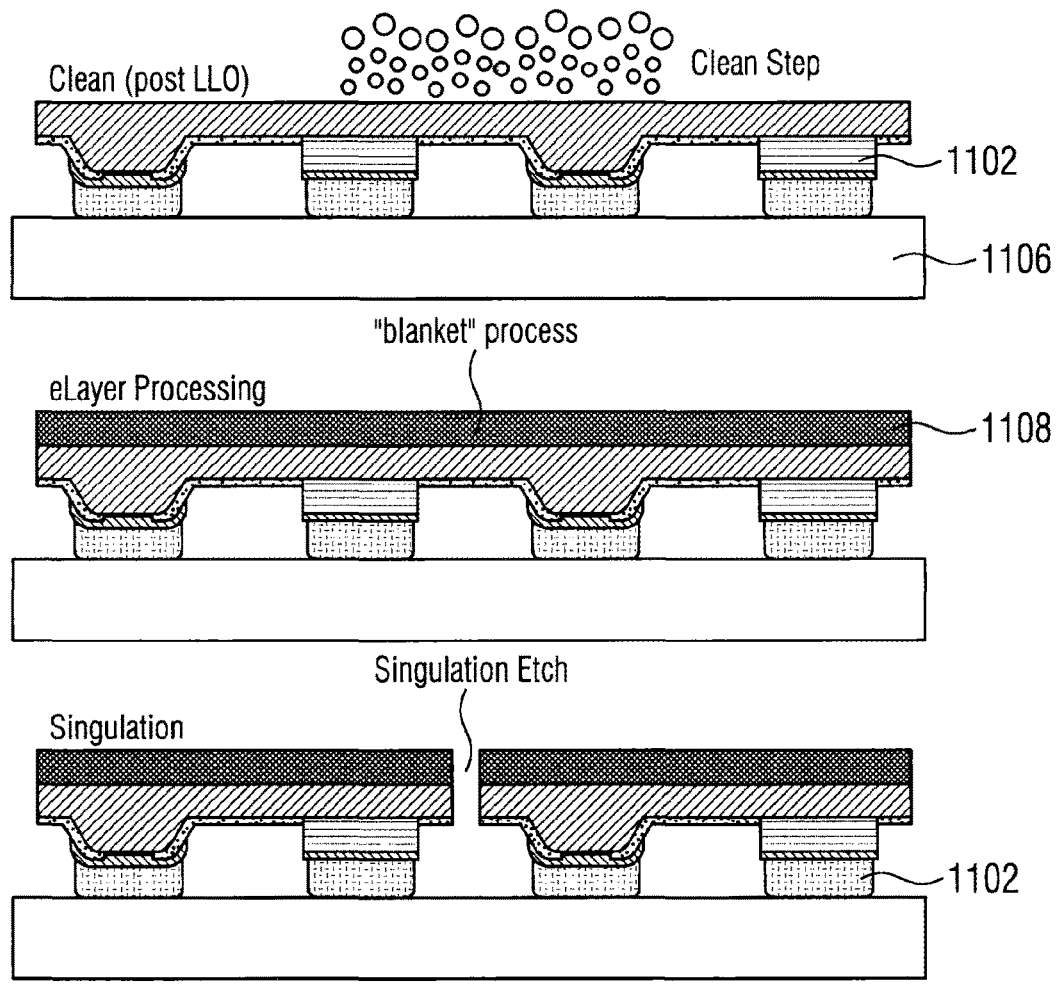
FIG. 11 is a schematic view of an exemplary non-selective deformable layer deposition process.

Referring to the top of FIG. 11, in some examples a cleaning step may be required after the removal of the substrate from the devices to remove any residue. This cleaning step may be applied after the sapphire or GaAs substrate removal process.

After the cleaning step, a deformable material can be deposited on the devices 1102 to form an intermediate layer 1108 (eLayer). This intermediate layer 1108 may be deposited on all devices 1102 on the handle layer 1106 (non-selective deposition) or to selected dies 1102 on the handle layer 1106 (selective deposition). The deposition of the intermediate layer 1108 will be explained in more detail below.

An exemplary deformable material used to form the intermediate layer 1108 includes an elastomer, which is transparent in the visible wavelength range, has a thermal stability, e.g. up to 300° C., and a high chemical and physical stability. The deformable material may have a hardness of Durometer shore A 55 or a Young modulus of about 3 MPa and may be curable by irradiating the deformable material with UV light or at low temperatures, such as temperatures below 125° C.

Examples of the deformable material include a siloxane based elastomer, such as polydimethylsiloxane (PDMS). PDMS is non-toxic, biocompatible and can be used to form features having sizes in the nanometer range. The applications for PDMS are diverse and include as an example its use as a biomaterial to match the elastic modulus of soft tissues to study cell mechanobiology in muscle and nerves.

FIG. 11 shows an exemplary process for non-selective deposition of the deformable material to form the intermediate layer 1108. Exemplary techniques for non-selective deposition can include one or more of spray coating, spin coating and lithography. Other exemplary techniques can include moulding preforms of the deformable material on the top surface of each die or microcontact printing on the surface of every device with the deformable material be used as an ink.

Subsequent to the formation of the intermediate layer 1108, the intermediate layer 1108 is removed in spaces between neighbouring devices 1102 and the devices 1102 are singulated, as shown in the bottom of FIG. 11. An exemplary method for doing this includes patterning of the intermediate layer 1108 followed by a dry etch step using a metal hard mask. Dry etch used for patterning the intermediate layer 1108 can include SF6 and O2, while dry etch for singulation of the devices 1102 may include chlorine based etch. In other examples, the intermediated layer 1108 may be deposited on individual a device using, for example, a spray coating, moulding and stencil process. The use of the spray coating and stencil process may not require any patterning of the intermediate layer 1108.

Figure 12:
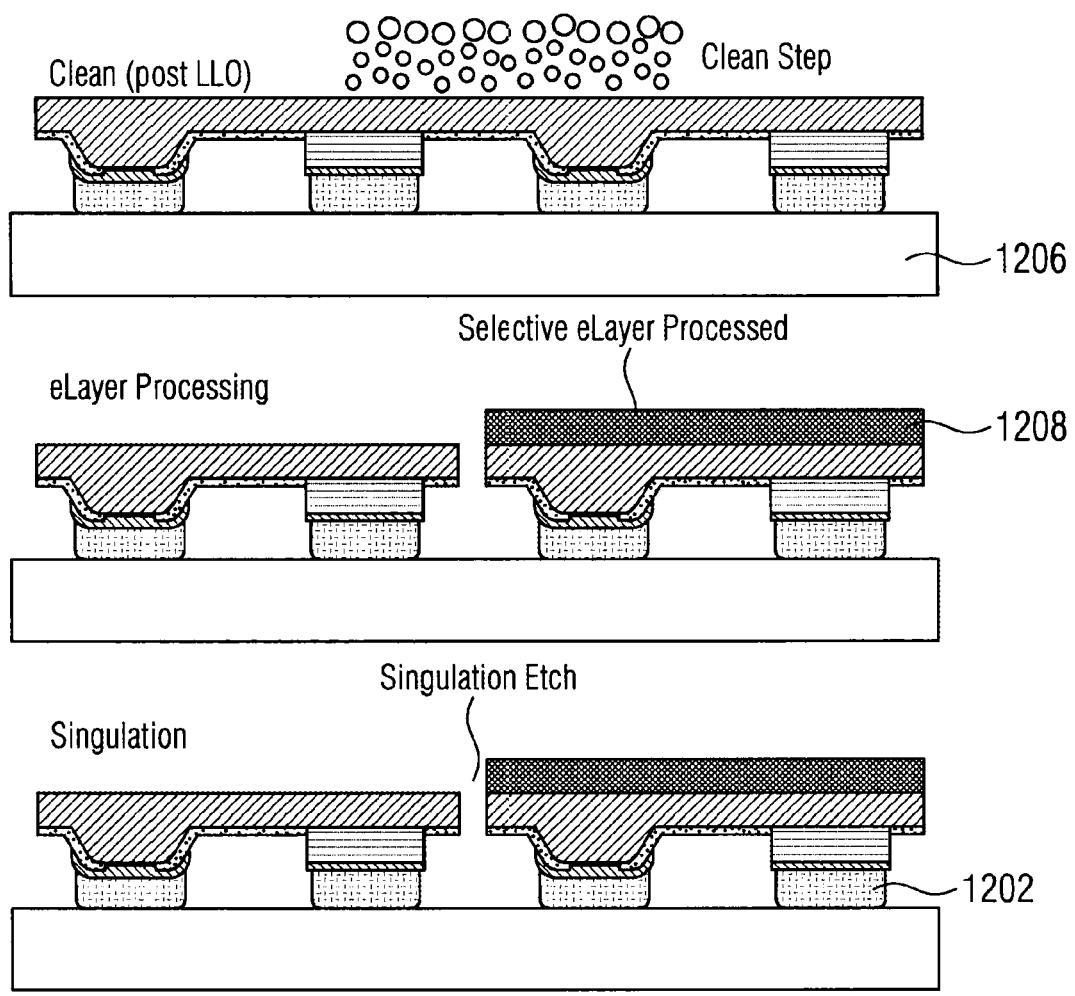
FIG. 12 is a schematic view of an exemplary selective deformable layer deposition process.

FIG. 12 shows an exemplary process for selective deposition of the deformable material to form the intermediate layer 1208. The process is similar to that shown in FIG. 11 and described above. However, in this example selective deposition of the deformable material is achieved by inkjet or super inkjet printing of the deformable material on selected devices 1202. These techniques include precision placement of small volumes, such as picolitre volumes, of deformable material, which in this example has a low viscosity, on the surface of the selected devices 1202. After the deformable material has been deposited on the selected devices 1202, the devices 1202 are singulated using the dry etch process described above.

Figure 13:
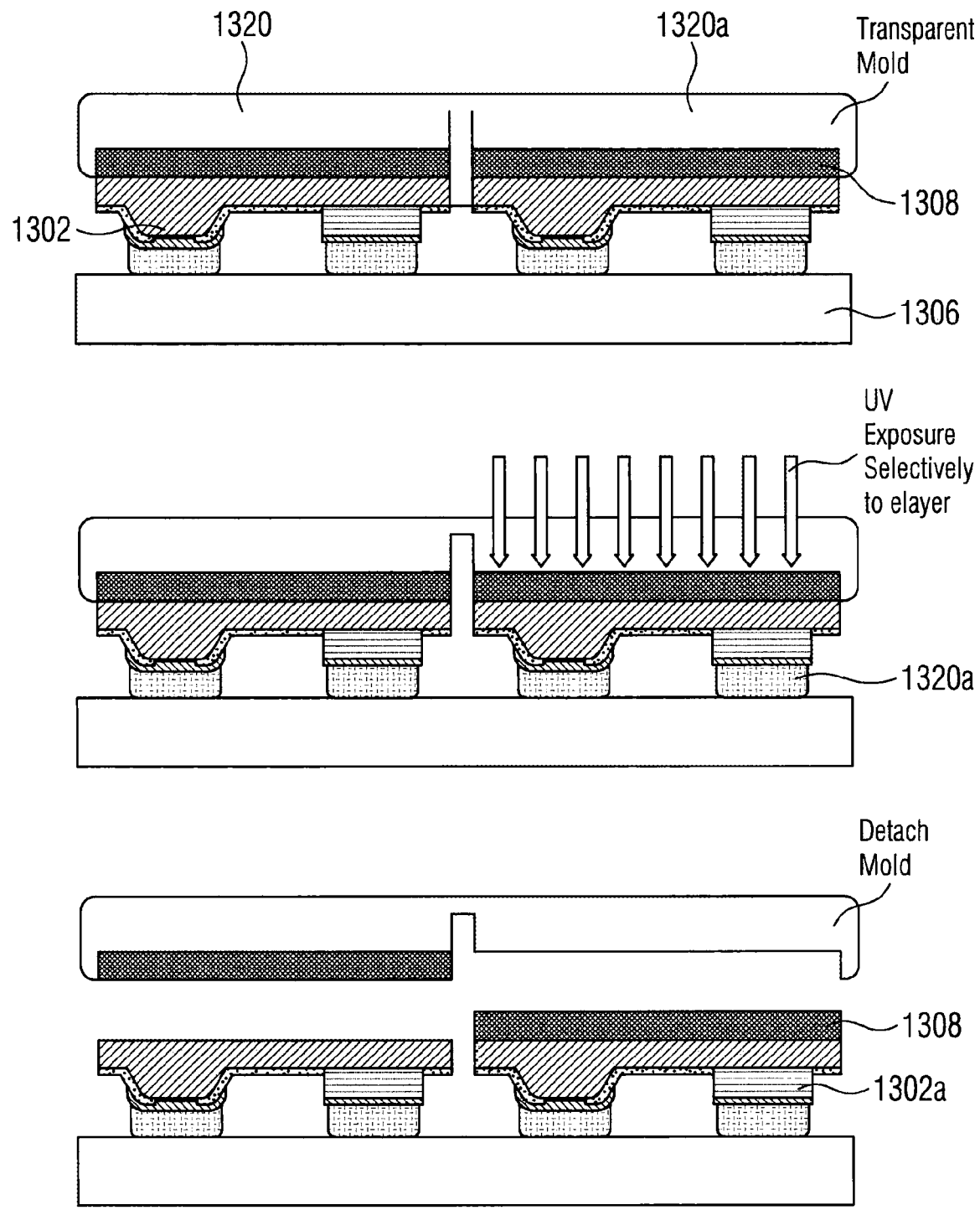
FIG. 13 is a schematic view of an exemplary selective deformable layer deposition process.

An alternative process for selectively depositing deformable material is shown in FIG. 13. In this exemplary process the deformable material is applied to a mould 1320 and the mould 1320 is engaged with a surface of the devices 1302 so that the deformable material is in contact with the surface of the second LED dies. The mould is transparent to permit the deformable material to be irradiated with light. As used herein, the term light encompasses light of any wavelength including visible and invisible light. In the exemplary process shown in FIG. 13, UV light is used. A portion 1320*a* of the mould 1320 is selectively irradiated with the UV light. The location of the portion 1320*a* of the mould 1320 corresponds to the location of a selected device 1302*a*. The irradiation of the portion 1320*a* of the mould 1320 with UV light cures the deformable material to the selected device 1302*a*. This increases a level of adhesion between the deformable material and the selected devices 1320*a*. When the mould 1320 is removed from the surface of the devices 1320, the deformable material adheres of the selected device 1302*a*, thereby forming an intermediate layer 1308 on the selected device 1302*a*. The deformable material that has not been cured is removed with the mould 1320 from the remaining device. It will be appreciated that this process may be used to deposit the deformable material to a plurality of selected devices, using either selective or non-selective methods, as disclosed herein.

Figure 14A:
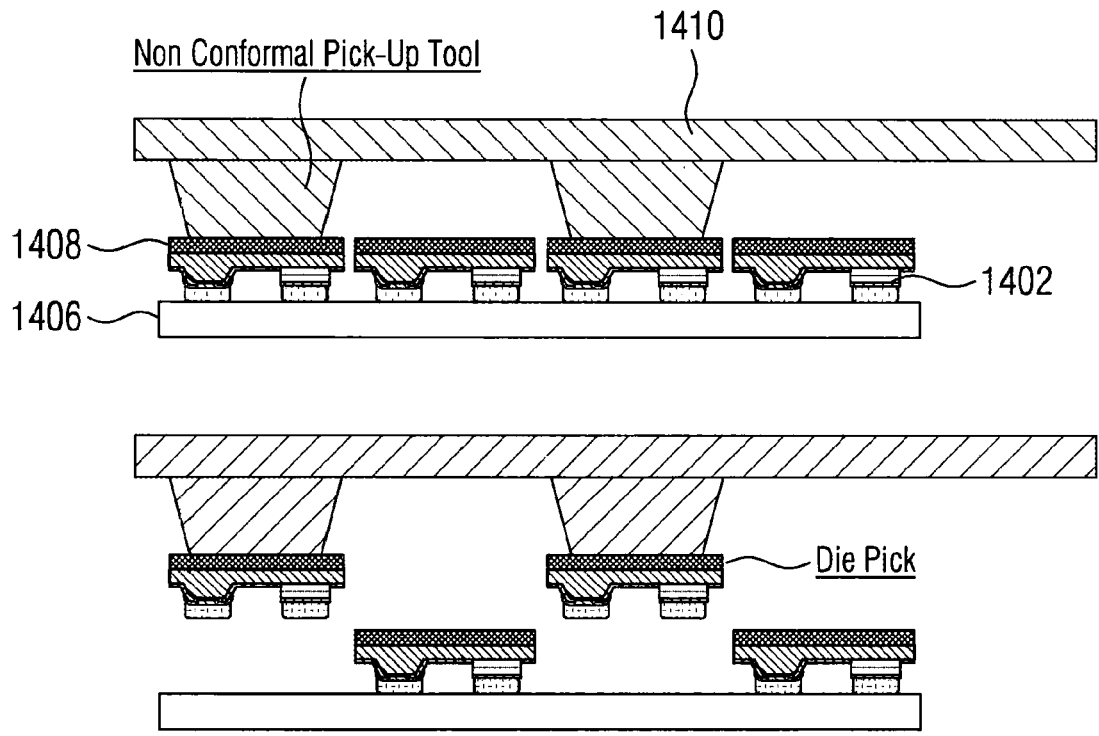
FIG. 14(a) is a schematic view of an exemplary non-selective pick up process.
Figure 14B:
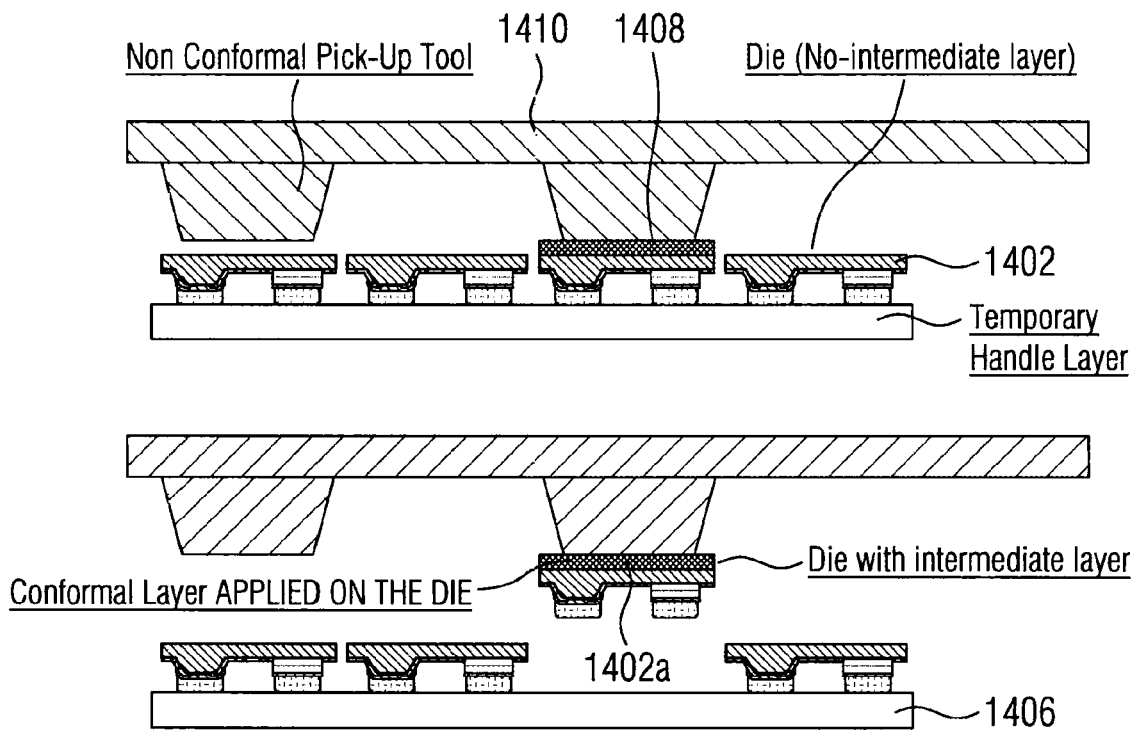
FIG. 14(b) is a schematic view of an exemplary selective pick up process.

The pick-up of devices 1402 is shown in FIGS. 14(*a*) and 14(*b*). The transfer head 1410 of the PUT contacts the upper surface of intermediate layer 1408, which causes the devices 1402 to adhere to the transfer head 1410 through the intermediate layer 1408. The devices can then be transferred and placed on the TFT layer (not shown). Once placed, the transfer head 1410 can be removed from the conformal devices using a suitable release mechanism, such as adhesive surfaces on the transfer head 1510, which are switchable by the application of an external parameter (e.g. UV light, temperature and/or pressure). Alternatively or additionally, microstructures on the intermediate layer can be used to control adhesion force between the transfer head and the intermediate layer. The pick-up process shown in FIG. 14(*a*) is referred to as non-selective pick up since every device 1402 has an intermediate layer 1408 applied to it. The PUT is a non-selective PUT and picks up every device 1402 that is contacted by the transfer head 1410 during the pick-up process, as shown in FIG. 14(*a*).

In the example of FIG. 14(*b*), the deformable material, which forms the intermediate layer 1408, has been applied to a selected device 1402*a*. The transfer head 1410 of the PUT only contacts the intermediate layer 1408 on the selected device 1402*a*. This results in only the selected device 1402*a* being picked up by the transfer head 1410 of the PUT, as shown in FIG. 14(*b*). By applying the deformable material on selected devices, selective pick up of these devices, e.g. by a non-selective PUT may be permitted. This may negate the use of a selective PUT.

Figure 15A:
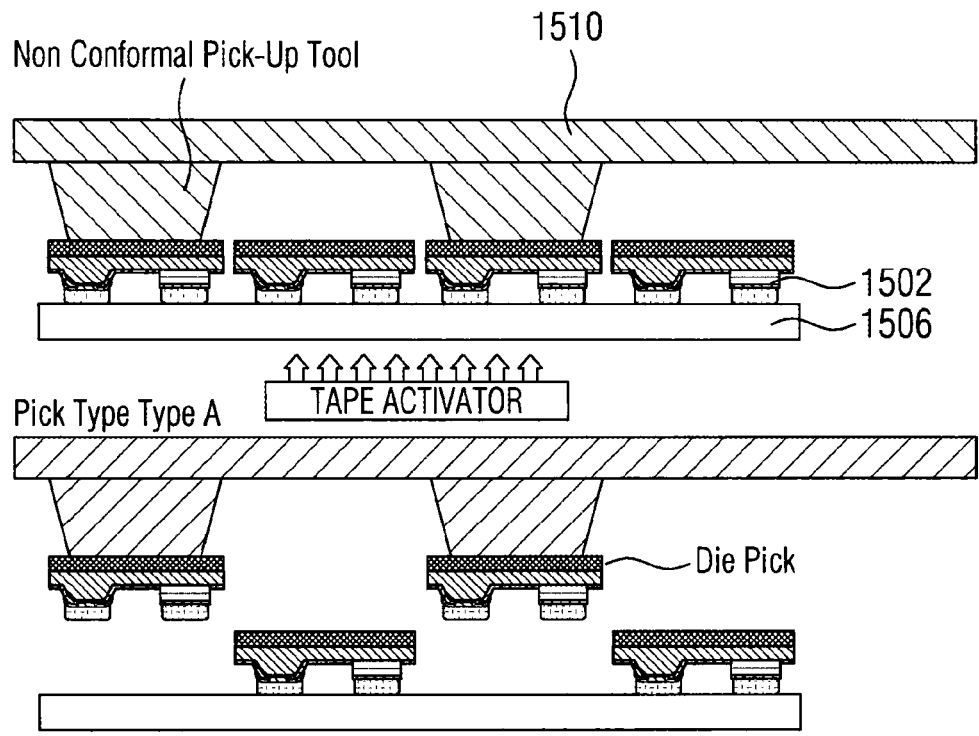
FIG. 15(a) is a schematic view of an exemplary non-selective pick up process.
Figure 15B:
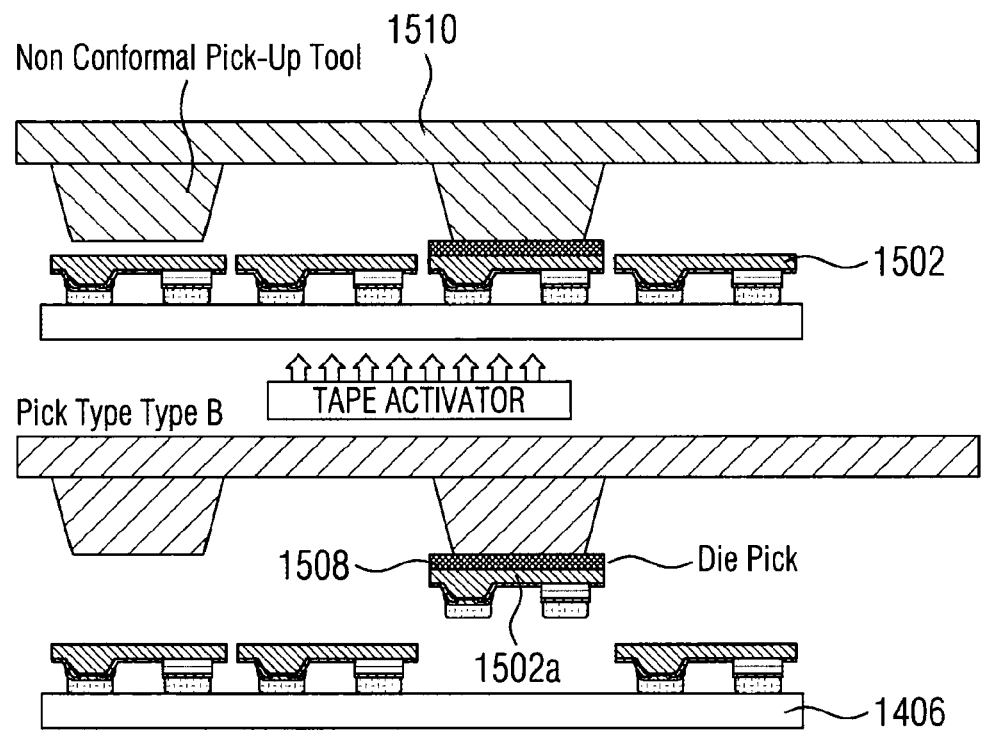
FIG. 15(b) is a schematic view of an exemplary selective pick up process.

As described with reference to FIG. 9, one or more UV tape(s) may be used to attach the devices to the handle layer. FIGS. 15(*a*) and 15(*b*) shows an exemplary non-selective and selective pick up process, respectively, in which the adhesion strength of the devices 1502 to the handle layer 1506 can be modified by irradiating the UV tapes with UV light. The irradiation of the tapes on the handle layer 1506 causes a level of adhesion between the devices 1502, 1502*a* and the handle layer 1506 to be less than a force applied by the transfer head 1510 of the PUT and thereby enables non-selective pick up and/or selective pick up of the devices 1502, 1502*a* from the handle layer 1506 by the transfer head 1510 of the PUT (e.g. as described above in relation to FIGS. 14(*a*) and 14(*b*)).

FIGS. 16(*a*) to 16(*d*) show a schematic view of an ILED or µLED display 1600 or part thereof. The display 1600 includes a 1×3 matrix of display pixel locations 1622*a*. Each pixel location 1622*a* includes a 3×3 matrix of sub-pixel locations 1624*a*, which results in each pixel having two redundant sub-pixel locations 1624*a*. Each sub-pixel may be populated with an ILED or µLED device. The device may include a single µLED emitter or a plurality of µLED emitters. The colour of the µLED emitters may be one of red, green or blue and may therefore be used to form a sub-pixel 1624*b* of a display pixel 1622*b*.

An exemplary display assembly process flow will be described in more detail below. The process may involve a single assembly station that undertakes a plurality of placement cycles In other examples, a first placement cycle may be undertaken by a first assembly station and alternative assembly station may undertake the, or each, subsequent placement cycle(s).

In FIG. 16(*a*) none of the sub-pixel locations 1624*a* are populated by a respective µLED device.

In a first placement cycle A, the PUT picks up an array of µLED devices from the handle layer, as described above. Each of the of the µLED devices in the array is configured to provide a sub-pixel 1624*b* of the display 1600. The array of µLED devices is placed on the TFT layer and may form a matrix of µLED devices of corresponding pixel locations on the display 1600. The placement may begin at one corner of what will become a display. The process of picking and placing is then repeated until all pixels 1622*b* of the display 1600 have a µLED die forming a sub-pixel 1624*b* of the pixel 1622*b*. When repeating the pick, the PUT may move the pick location on the handle layer sequentially to a next µLED device and move the place location to a next matrix of pixels of the display, which may be adjacent to the first matrix of pixels in a chess board pattern. Once all pixels of the display 1600 include a sub-pixel 1624*b* of one colour (red, green or blue), the picking and placing process is repeated for the remaining two colours. The result of this is a display including a plurality of pixels, each pixel including a µLED device of each of red, blue and green, as shown in FIG. 16(*b*). The µLED device used in this first placement cycle A include untested µLED devices, e.g. µLED devices that have not been wafer tested and/or are inferred good dies (e.g. blind built).

Subsequent to the first placement cycle A, the µLED devices are tested to determine pixel locations of one or more non-functional or defective µLED emitter(s), which are crossed out in FIG. 16(b). The test may comprise all devices having a current applied to them in reverse bias and/or forward bias. This may be done for all sub-pixels of each pixel. It is then determined whether any of the µLED devices are defective, i.e. do not contain a functional µLED emitter (e.g. using a photodetector, such as a camera) or has a parametric defect detected from the diode characteristics (e.g. using a filter), and at which pixel locations. The pixel locations of one or more non-functional or defective µLED emitter(s) are then recorded and stored in a defect map for cycle A, which may subsequently be used for the calibration of the display 1600.

Based on a result of the test, e.g. the defect map, one or more tested µLED devices or Know Good Dies (KGD), which may be positioned on another handle layer or on the same handle layer as the untested µLED devices but at a different location, are selected and configured to enable their pick up and placement by a PUT in the second placement cycle B1. The selected µLED devices are configured to provide the same sub-pixel of the display as the non-functional LED emitters. The step of configuring the tested µLED devices may include selective deposition of the deformable layer on the selected µLED devices, as described above.

In the second placement cycle B1 the PUT picks up of one or more selected µLED devices and places the selected µLED devices on the TFT of the display 1600 at locations corresponding to the pixel locations of the non-functional LED emitters, as shown in FIG. 16(c). By picking up and placing tested or KGD dies in the second placement cycle B1 on the TFT layer, the number of redundant µLED dies placed on the TFT layer and the number of placement cycles may be reduced, which may result in cost and time reductions.

The second process of picking and placing is then repeated until all pixels locations of non-functional µLED emitters have a selected µLED device, which forms a sub-pixel 1624b When repeating the pick, the PUT may move the pick location on the handle layer mounting the selected µLED devices sequentially to a next selected µLED device and move the place location to a next pixel location having a non-functional µLED emitter. Once all pixel locations of non-functional µLED emitters include a sub-pixel 1624b of one colour (red, green or blue), the picking and placing process is repeated for the remaining two colours, as shown in FIG. 16(c). The second placement cycle may be undertaken by a single assembly station.

Subsequent to the second placement cycle B1, the µLED devices are tested, as described above in relation to the first placement cycle A, to determine pixel locations of one or more non-functional or defective µLED emitter(s), which are crossed out in FIG. 16(c). The pixel locations of one or more non-functional or defective µLED emitter(s) are then recorded and stored in a defect map for cycle B1, which may subsequently be used for the calibration of the display 1600.

FIG. 16(c) shows that one of the three pixels includes no functional µLED emitters for the colour red. Based on a result of the test following the second placement cycle, e.g. the defect map for cycle B1, the selection of tested µLED dies or KGD is repeated. The second placement cycle B1 is then repeated as a placement cycle B2, as indicted in FIG. 16(d).

The testing, selection and placement cycle B1 (or B2) may be repeated until there is a functional µLED emitter for each colour (red, green or blue) in nearly all (e.g. 99% or more) pixel locations of the display.

Exemplary µLED devices have their electrical contacts all on one side opposite the light emission surface, which enables the µLED devices to be powered for testing from the TFT layers immediately after placement.

Figure 17:
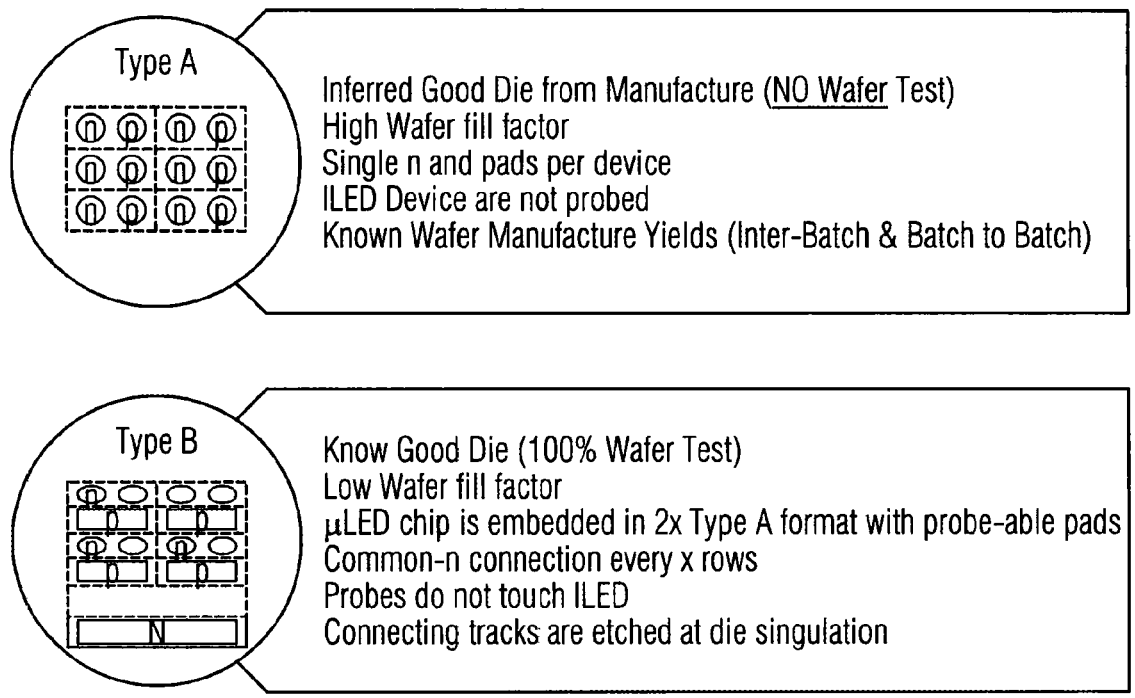
FIG. 17 is a schematic view of exemplary μLED dies.

Exemplary µLED dies, which can be used in the first and second or any subsequent placement cycles, may have the same performance parameters. As described above, the µLED devices, which may be used in the first placement cycle, have not been tested at wafer level and are shown in FIG. 17 as type A. The wafer yield of type A µLED devices may be known from wafer to wafer and batch to batch and controlled during manufacture. FIG. 17 shows a 3×2 matrix of exemplary type A µLED devices and a 2×2 matrix of exemplary type B µLED devices. The type B µLED devices may be used in the second placement or any subsequent placement cycles. The type B µLED devices are KGD, e.g. have been tested at wafer level, e.g. using probes cards for example.

The type A dies may be manufactured in higher densities than the type B dies and have a single n- and p-contact on one side of the devices

| Placement Round | Wafer Yield | Failed Pixels |
|---|---|---|
| 1: Cycle A (untested die) | 90% | ~30,900 |
| 2: Cycle B1 (KGD) | 100% | ~30 |
| 3: Cycle B2 (KGD) | 100% | 0 |

Table 1 illustrates an example of the number of failed pixels in dependency of the number of placement cycles. The display used to calculate the number of failed pixels in Table 1 is a 320×320 pixel colour display. The total number of sub-pixels requiring placement on the TFT layer for all colours (red, green or blue) is 307,200. In the example shown in Table 1, the wafer yield for untested µLED emitters is 90% and the assembly yield is 99.99%. This results in about 31,000 non-functional µLED emitters, which were identified after the first placement cycle.

As described above, during the second placement cycle, tested or KGD µLED emitters may be used. Although, the µLED emitters have been tested, there is the possibility that some of the µLED emitters are non-functional (e.g. the µLED emitters may have been damaged during the pick-up and place process or any of the previous process steps, described above). The example in Table 1 shows a yield loss of 0.001% or 10 non-functional µLED emitters. By repeating the second placement cycle, the number of non-functional µLED emitters may be decreased to zero, as show in Table 1 The increased wafer yield of the tested µLED may lead to a reduced number of placement cycles, which in turn may result in reduced time and cost needed to manufacture the display.

Figure 18:
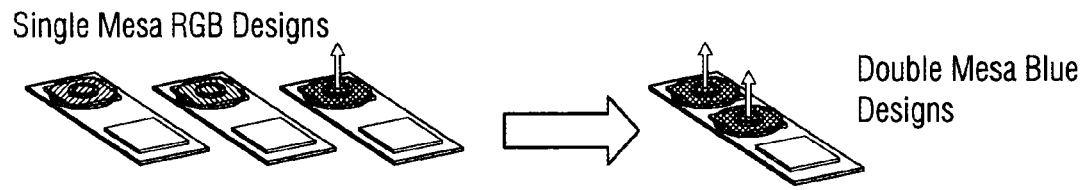
FIG. 18 is a table of exemplary display yields.

FIG. 18 shows of comparison of display yields for µLED devices including a single emitter and µLED devices including a plurality of emitters (e.g. two emitters). When 15 µLED devices comprises a plurality of emitters instead of a single emitter per LED die, FIG. 18 shows that such plurality emitter devices can reduce the number of placement cycles and/or µLED devices required per pixel to obtain an acceptable display yield. The use of µLED devices including a plurality of emitters may reduce the time and/costs required for the assembly of a display.

Figure 19:
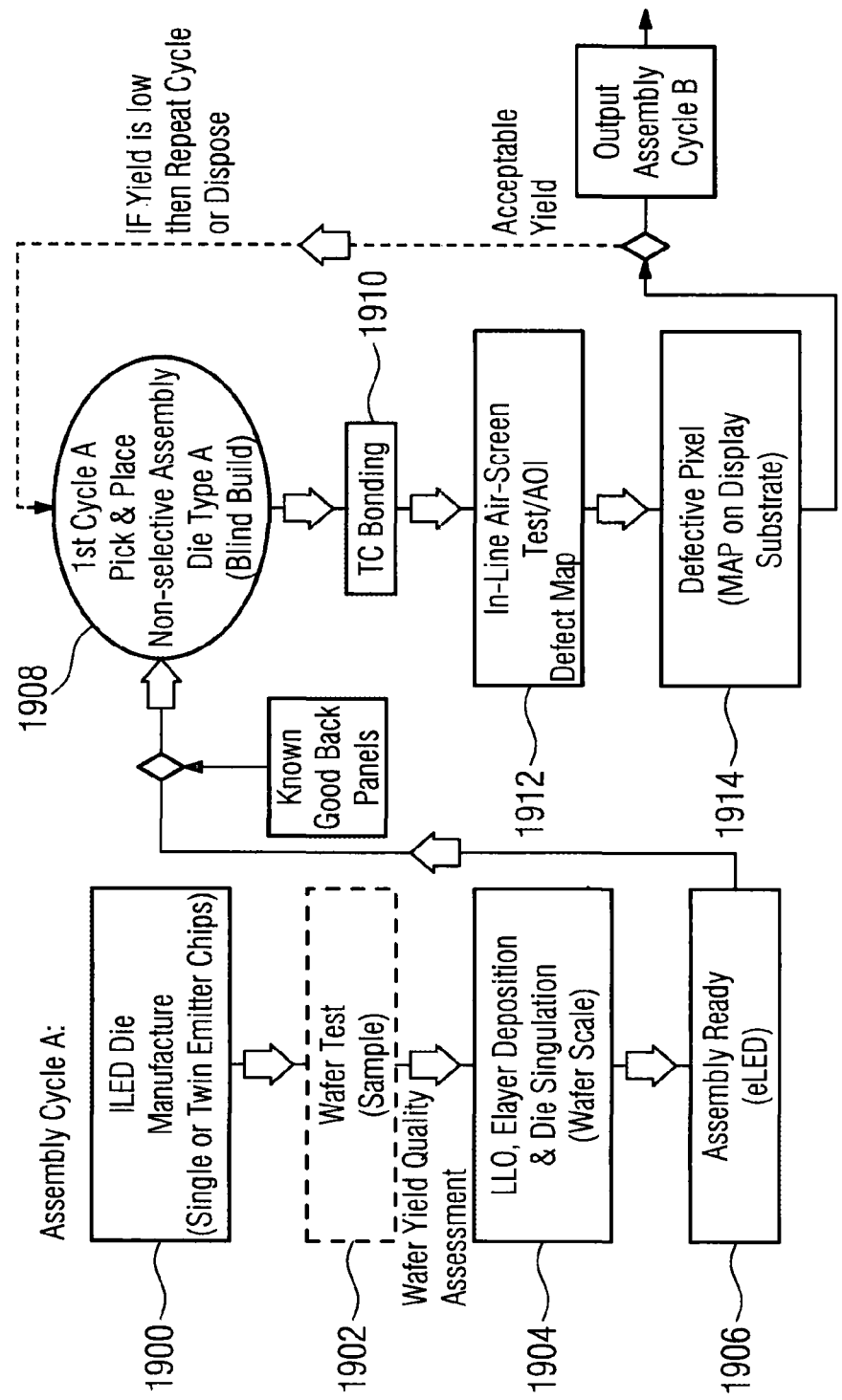
FIG. 19 is a flow diagram.
Figure 20:
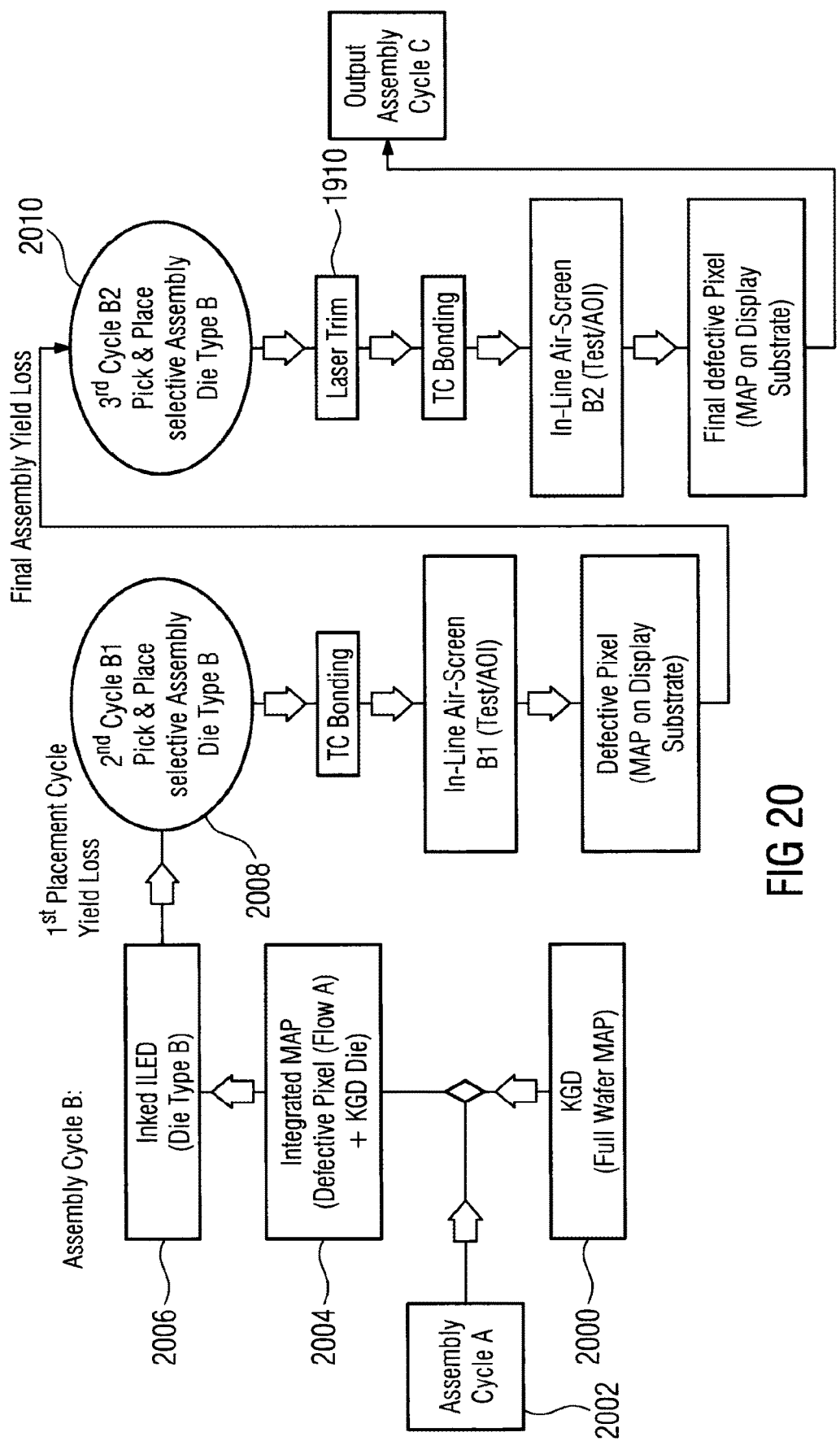
FIG. 20 is a flow diagram.

FIGS. 19 and 20 show the process flow of an exemplary manufacturing method.

FIG. 19 shows the flow of an exemplary assembly cycle A, which is discussed above. The left hand side of the process flow of the assembly cycle A has been described above in relation to FIGS. 5 to 12. As shown on the left hand side in the process flow of cycle A, the manufactured μLED dies may be tested in some examples to assess a wafer yield quality. The right hand side of the process flow of assembly cycle A was described in detail in relation to FIGS. 16(a) to 16(d), The right hand side of the process flow of cycle A includes a bonding step, which will be described below.

First μLED dies are manufactured 1900 and may comprise one or more first μLED emitters. Optionally, a wafer test 1902 may be conducted on a sample of the first μLED dies to determine the wafer yield. The first μLED dies are configured 1904 for pick and place onto a display substrate, which may be a TFT substrate. The configuration may comprise placing the first μLED dies on a handle layer using, for example, LLO. The configuration may also comprise deposition of a deformable layer onto the first μLED die to allow adhesion to a PUT. The configuration may also comprise singulation of the first μLED dies. After configuration, the first μLED dies are assembly ready 1906 and may be placed on the display substrate in the first placement cycle 1908, which may comprise placing arrays of one sub-pixel type in a chessboard pattern until all pixels of a display include one of the first μLED die corresponding to the sub-pixel type and then repeating for the other two sub-pixel types. TCB 1910 may then take place. The first μLED dies are tested 1912, as discussed above, to determine 1914 one or more locations of non-functional first LED emitters. e.g. one or a plurality of the first emitters on a first μLED die may be non-functioning due to LED manufacturing process yields or damaged/missing due to assembly failures.

FIG. 20 shows the flow of an exemplary assembly cycle B. The assembly cycle B includes the steps of bonding and trimming, which will be described below. The remaining steps shown in FIG. 20 have been described above in relation to FIGS. 5 to 10, 12, 13 and FIGS. 16(a) to 16(d). A process of determining KGD 2000 may be undertaken to prepare a plurality of second μLED dies before integration of the test result 2002 from the first placement cycle (FIG. 19). The results of the test may be used to determine a map 2004 of non-functional μLED die after the first placement cycle. Based on the results of the test, one or more second μLEDs are selected from the plurality of second μLEDs. For example, the sub-pixel type and/or location of the second μLED dies may correspond to the sub-pixel type and/or location of the non-functioning first μLED dies. The selected one or more second μLED dies are configured 2006 for pick-up by a PUT. This may be a selective pick-up process, such as those described above and may include the deposition of a deformable layer on the selected second μLED dies. The subsequent placement cycle 2008 is undertaken a similar way to the first placement cycle discussed above, although the further testing is optional and may be dependent on there being a further subsequent placement cycle 2010.

Figure 21:
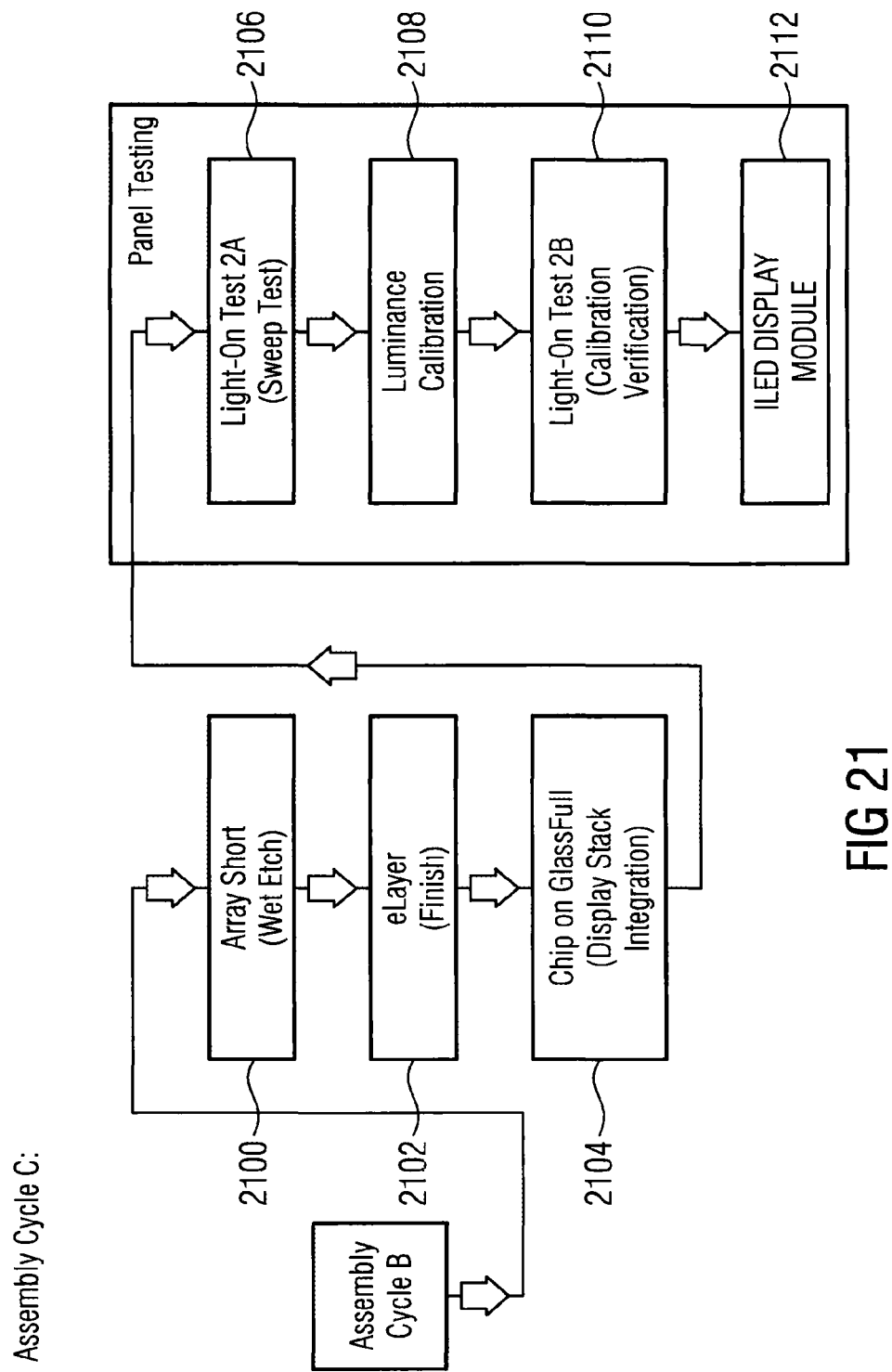
FIG. 21 is a flow diagram.

FIG. 21 shows the flow of an exemplary assembly cycle C, which may be part of the exemplary manufacturing method described herein. Steps 2100-2104 of the assembly cycle C show the final steps of the display assembly. sidesteps 2106-2112 of the assembly cycle C show an exemplary calibration cycle of the assembled display. This calibration cycle may be based on the defect maps, which were generated following the first and second placement cycles A, B1 (or any subsequent placement cycles B2).

The calibration cycle can include the step of disconnecting one or more non-functional or defective μLED emitters of the μLED devices placed on the TFT layer. For example, non-functional or defective μLED emitters may be isolated from a drive circuit on the TFT layer using a laser trim process, which opens or melts connections of the defective μLED emitters to disconnect the μLED emitters from the drive circuit.

The calibration cycle may comprise a laser trim function to isolate or disconnect defective subpixels (e.g. defective μLED emitters) from the drive circuitry which were identified in first and/or second assembly cycles (Cycle A and/or Cycle B1) from the working μLED emitters placed during the third assembly cycle (Cycle B2). Electrical repair strategies may be used to isolate defective μLED defective μLED emitters identified after the first assembly cycle (Cycle A) from working μLED devices placed and tested during the second assembly (Cycle B1).

Although the step of disconnecting the defective μLED emitters is described as being part of the calibration cycle, it will be appreciated that in other examples the disconnecting step may be performed after each placement cycle (e.g. A, B1 or B2).

Although the use of tested μLED devices has been described in relation to the second and/or third placement cycles (or any subsequent cycles), it should be understood that the methods and apparatus disclosed herein are not restricted to the use of tested, KGD, in the second and/or third (or any subsequent) selection, placement cycles. In some examples, untested (or blind built) μLED devices including a single μLED emitter or a plurality of μLED emitters may be used in the second and/or third (or any subsequent) selection, placement cycles. The second (or third) placement cycle may then be repeated until a predetermined display yield has been achieved.

The above described assembly cycles A and B include a step of bonding the μLED devices placed during the first, second or any subsequent placement cycles (e.g. A, B1 or B2) to the TFT layer. The bonding step may include temporary bonding (or pre-bonding) of the μLED devices to the TFT layer or permanently bonding of the μLED devices to the TFT layer.

An exemplary process used for temporary bonding of the μLED devices to the TFT layer will be described with reference to FIG. 22. As described above, a temporary bond between the μLED devices and contact pads on the TFT layer corresponds to a metal to metal contact between the bumps of the μLED devices and the contact pads on the TFT layer. This metal to metal contact may be a temporary bond, which permits testing of the μLED devices.

Figure 22:
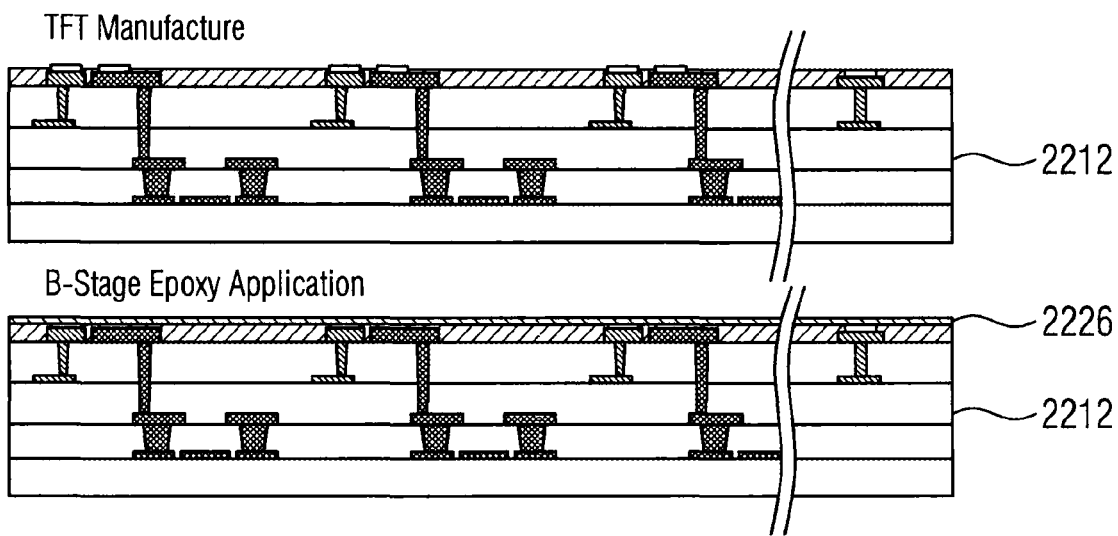
FIG. 22 is section through an exemplary TFT layer.

FIG. 22 shows an example of a TFT layer 2212. In the bottom of FIG. 22, an underfill or non-conductive layer 2226 has been deposited on the TFT layer 2212. The underfill or non-conductive film may be patterned onto the TFT layer 2212 between each placement cycle. Examples of underfills include B-stageable no flow underfills (BNUF), such as B-stage epoxy. B-stage epoxy is a descriptive term for an epoxy system that can be practically cured or "pre-dried" as an initial stage after being applied to a substrate or surface. At a later stage it can be completely cured under heat and pressure. The viscosity of the B-stage epoxy is complex as a function of temperature. The advantage of B-stage epoxy is that it can avoid manufacturing bottleknecks and increases production as final bonding does not have to immediately follow the application of the epoxy adhesive. Applications for B-stage epoxy includes hemetic packaging, flip-chip processing and optical gasket sealing of glasses. The underfill is deposited on the TFT layer at low temperature (typically <100° C.) and the µLED devices can then be placed on the TFT layer. At an elevated temperature, typically 100-200° C. the viscosity of the B-stage epoxy is low to allow excess material to be squeezed out from the interface between the µLED devices and TFT layer and flow, thereby enabling the metal to metal contact to occur. During this temperature exposure, the B-stage epoxy may have concurrent flux capability to remove native oxide on the Cu. This allows testing of the µLED devices after each placement. At a higher temperature, typically 200-300° C., the µLED devices can be permanently bond to the TFT layer, e.g., by thermocompression bonding, which will be described below. After permanently bonding of the µLED devices to the TFT testing can be carried out. The use of the underfill, as described above may avoid a manufacturing bottleneck of thermocompression bonding since the permanent bonding step does not have to occur immediately after the deposition of the underfill and each placement cycle of the devices on the TFT layer. The use of the underfill may prevent oxidation of the metal contacts of the µLED devices and the TFT layer, which may include Copper.

The B-stage epoxy can assist in the adhesion between the µLED devices and the TFT layer, thereby facilitating the release of the µLED devices from the PUT after placement.

Figure 23:
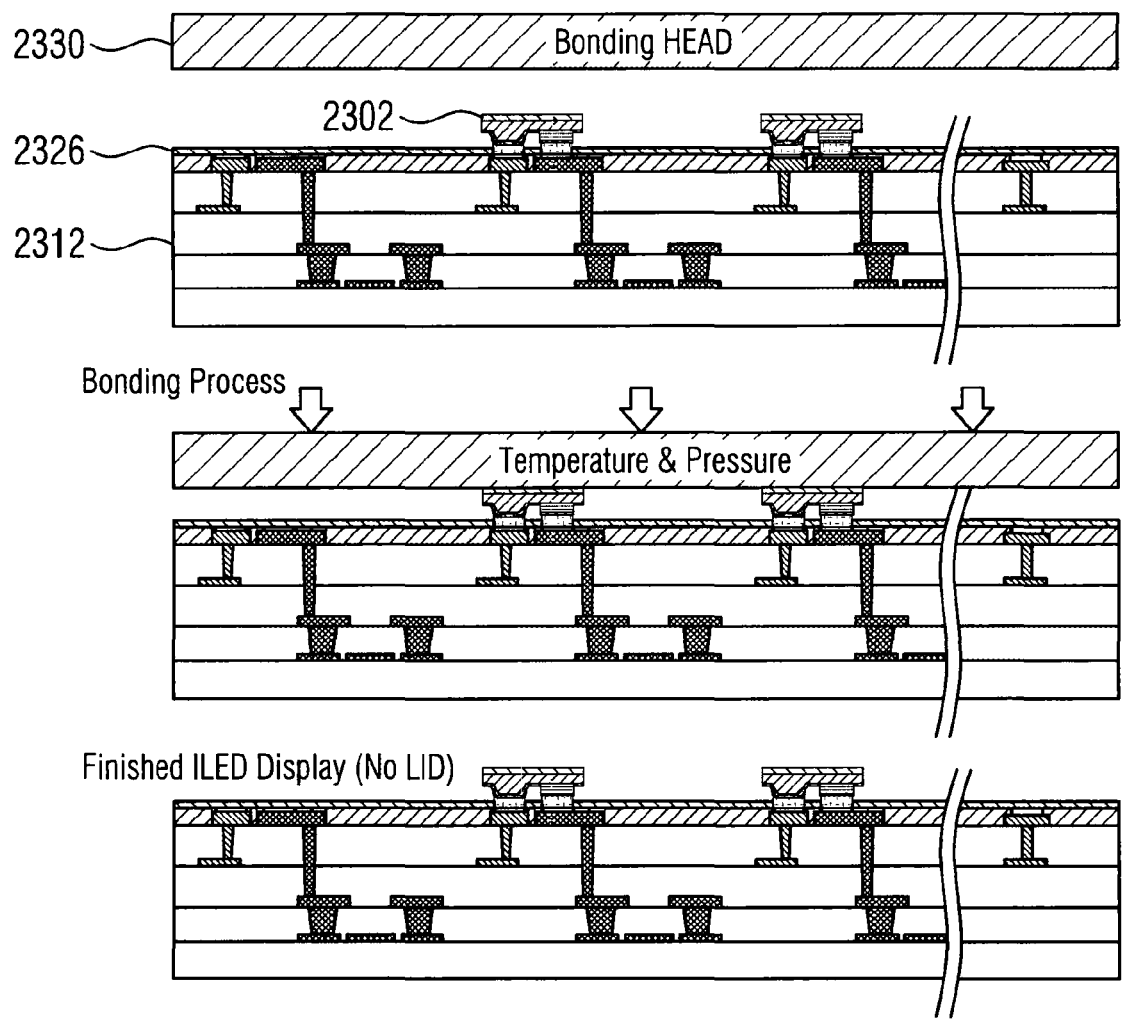
FIG. 23 is a schematic view of an exemplary bonding process.

FIG. 23 shows the final step of the exemplary manufacturing method disclosed herein. The µLED devices 2302 can be permanently bonded to the TFT layer 2312 using an exemplary thermocompression bonding (TCB) process. TCB may enable fine pitch 2.50 and 30 assembly technologies using fine pitch Cu pillar interconnects with pitches of about 40 µm and pillar heights of 30 µm. Placements accuracies are of the order of ±2 µm. TCB is, for example, used for memory products are driving the commercial volumes in the technology. FIG. 23 shows an exemplary bonding head, which may be a thermocompression bonding head. The bonding head 2330 contacts the µLED devices 2302 on the TFT layer 2312 and creates a permanent bond between the µLED devices 2302 and the TFT layer 2312, e.g. by creating reflow of the bump of the µLED devices (e.g. eutectic) or metallic interdiffusion, e.g. Solid Liquid Interdiffusion (SLID). SLID involves an excitation source, such as a thermal, compression or ultrasonic forces to create a permanent bond. In the example shown in FIG. 23 the bonding head 2330 is of the same size as the TFT substrate 2312. This may lead to a high throughput and reduced costs. During the bonding the thermal expansion coefficients (TCE) of the µLED devices 2302 need to be matched to those of the TFT layer to reduce the thermomechanical stress in the assembled display and to achieve bonding across the TFT layer. The pre-applied underfill may act to distribute a thermal expansion mismatch between the device and the TFT layer and/or to reduce any stress in the bond between the µLED devices 2302 and the TFT layer 2312, thereby improving the quality of the metallurgical bond.

Figure 24:
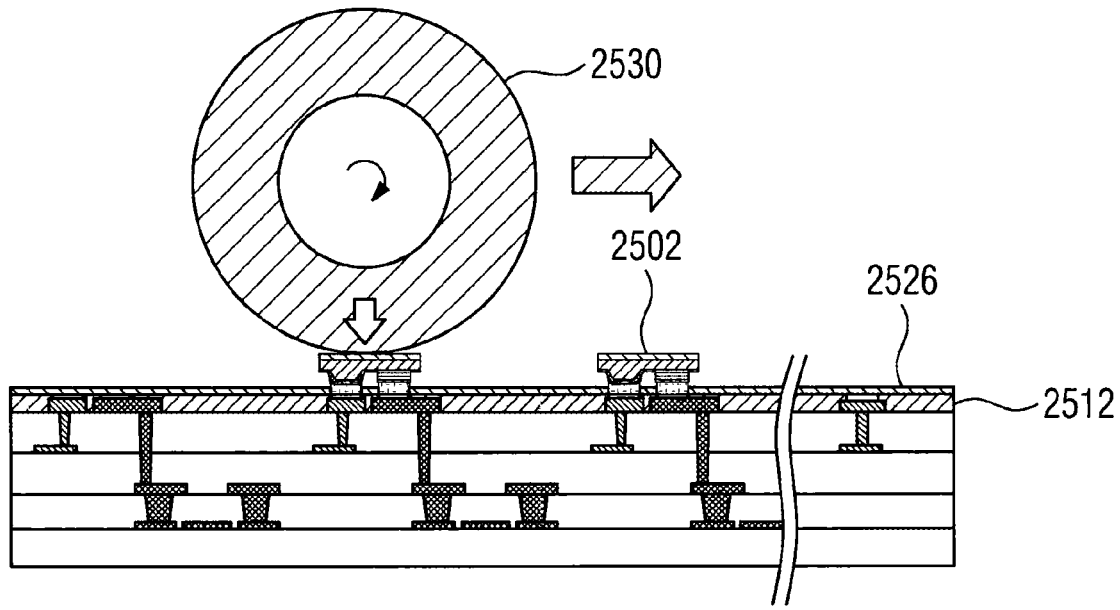
FIG. 24 is a schematic view of an exemplary bonding process.

FIG. 24 shows an alternative exemplary bonding head 2430, such as a TCB head, which may be used to bond the µLED devices 2402 to the TFT layer 2412. The TCB 2430 head is provided in the form of a drum, which is configured to move, e.g. rotate or roll, across the TFT layer 2412 and apply a force to the µLED devices. The drum applies a linear pressure along µLED dies 2402 on the TFT layer 2412. This may eliminate in-built stress and TCE mismatch between the TCB bond head and the TFT layer and/or may allow control of the necessary compression forces. In exemplary methods for display manufacture, one or more LED dies may be placed on a display substrate. The one or more LED dies may be placed on the display substrate according to any of the methods disclosed herein. The LED dies may comprise a bonding element, such as a bump or micro bump. A TCB head in the form of a drum may be used to provide a compressive force and a thermal transfer configured to activate the bonding element of the LED dies. The drum may be rolled across a plurality of LED dies in order to bond them to the display substrate.

Manufacturing processes are disclosed which address the assembly of semiconductor chips to form an ILED image generator for display products.

It is an objective of the methods and apparatus disclosed to provide an image generator and associated method of manufacture using a plurality of ILED chips which are specially designed to enable their contact and conformance to a PUT tool for handling and manipulation onto a TFT glass panel.

An Inorganic Light Emitting Diode (ILED) image generator is disclosed using a novel micro LED design and micro transfer assembly method. The ILED image generator comprises a substrate and a plurality of µLED chips and an intermediate layer. In exemplary methods and apparatus, the term ILED encompasses a µLED. The intermediate layer is disposed onto at least one surface of the µLED chip and covers the µLED surface. The intermediate layer is deformable and may conform to the surface of the PUT. The intermediate layer may be a continuous layer or can be patterned with microstructures which facilitate the adhesion of the µLED chip for pickup, transfer and release using a non-conformal Pick Up Tool (PUT) transfer head. After assembly the intermediate layer can be removed using a release layer or through chemical degradation.

The method disclosed facilitates the assembly of µLED chips in pre-determined positions to manufacture an ILED image generator An assembly method to manufacture inorganic light emitting diode (ILED) image generator for displays is disclosed. ILED displays are a new generation of display technology for use particularly, but not only, in energy sensitive/battery powered display applications such as wearables devices, wearable device, smart phone, tablet, laptop.

In exemplary methods and apparatus, an assembly method to manufacture an image generator for an ILED display is disclosed. Specifically, a method for pick and place (or movement) of ILED chips is disclosed using an intermediate layer which is on the ILED chip (and may be structured) and "intermediate" between the ILED chip and the print head during assembly. The use of the intermediate layer results in a conformal contact between the contact surface of the pick up tools (PUT) and the conformal (or deformable) surface of the intermediate layer leading to intimate contact substantially without voids—a necessity for optimal stiction of the ILED chip onto the contact surface of the PUT. The chips whether individually or collectively form the subpixels of the display pixel and are assembled using this technique onto a glass thin film transistor (TFT) panel in a predefined pitch to create the ILED image generator.

Figure 25:
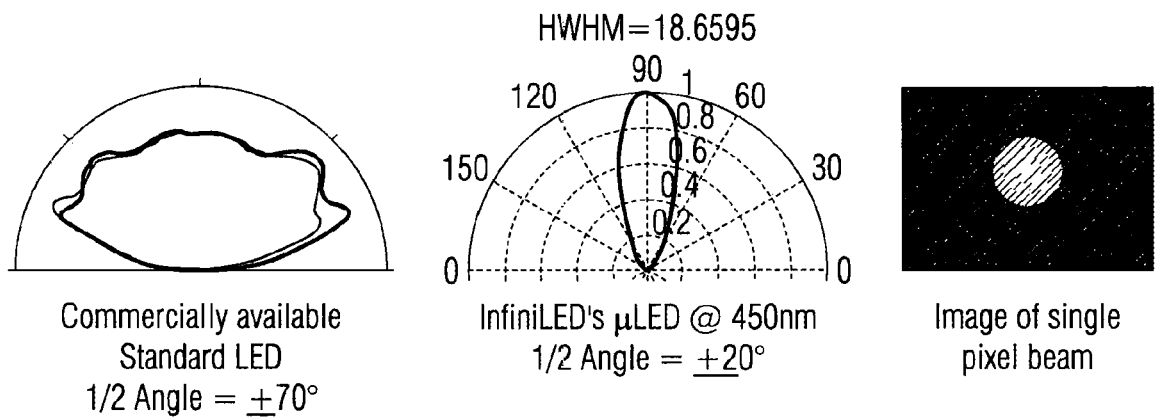
FIG. 25 shows a beam profile output from a commercial planar LED device and from μLED devices

The term "µLED technology" as used herein encompasses micron size LED device manufacture which directionalise the light output and maximise the brightness level observed by the user. The µLED as disclosed in U.S. Pat. No. 7,518,149 is a next generation LED technology developed specifically to deliver directionalised light, i.e. only to where it is required. The µLED is typically <20 µm in diameter with a parabolic structure etched directly onto the LED die during the wafer processing steps to form a quasi-collimated light beam emerging from the chip (FIG. 25). The micro ILED emitter shows a micro ILED structure similar to that proposed in WO 2004/097947 (U.S. Pat. No. 7,518,149) with a high extraction efficiency and outputting quasi-collimated light because of its shape. Such a micro ILED 300 is shown in FIG. 1.

This shaped structure results in a significant increase in the efficiency into low illumination angles when compared to unshaped or standard LED chips, see FIG. 25. This increased efficiency and collimated output of the μLED is such that it can produce light visible to the human eye with only nano-amps of drive current.

Conformal μLEDs comprise of μLED chip having an intermediate layer. The intermediate layer is disposed onto at least one surface of the μLED chip and covers the μLED surface (i.e. emission surface 110 of FIG. 1). The intermediate layer is conformal enabling this layer to form a conformal contact with another contact surface, such as a substantially rigid surface of a PUT.

Figure 26:
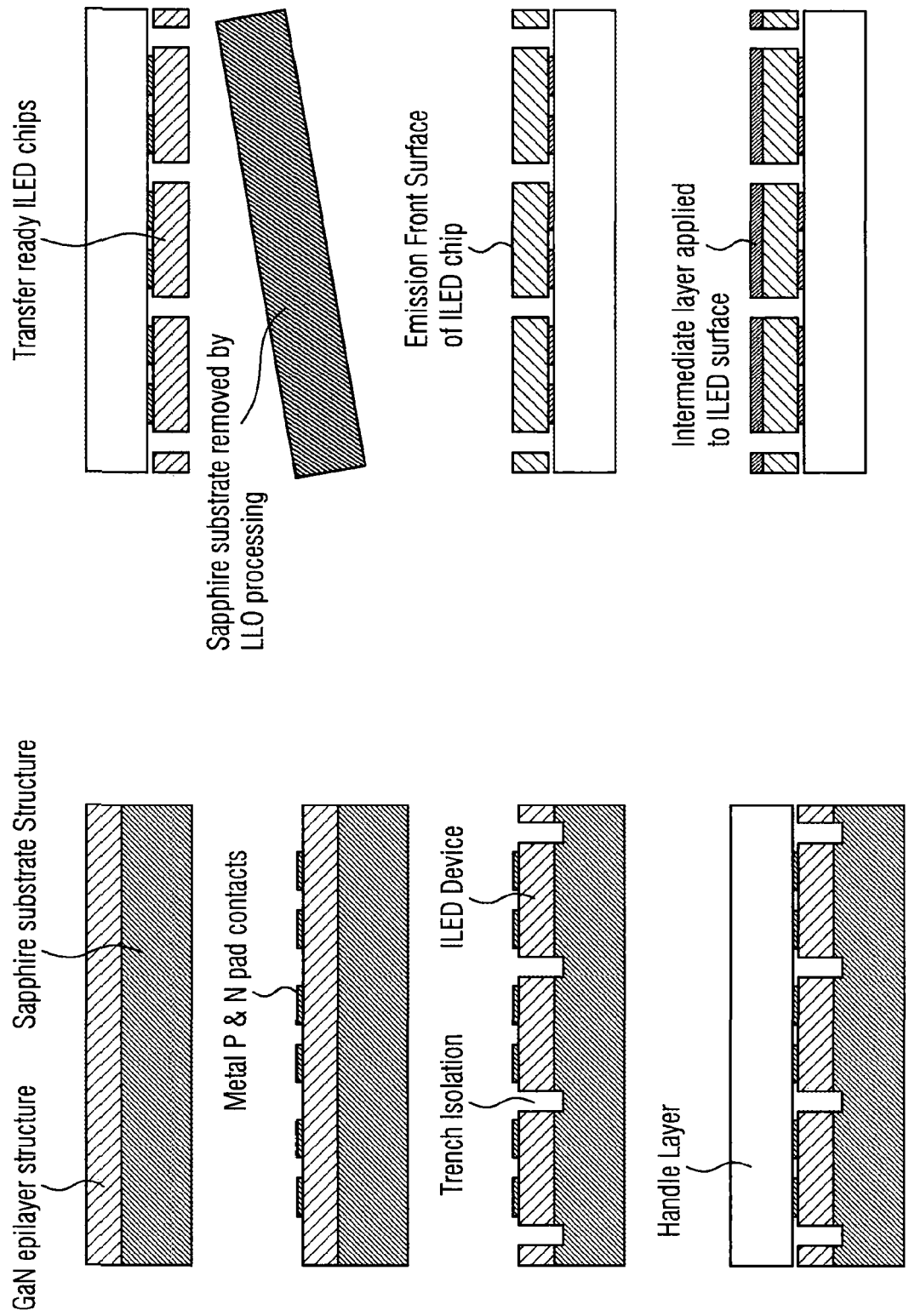
FIG. 26 shows an exemplary assembly process flow.
Figure 27:
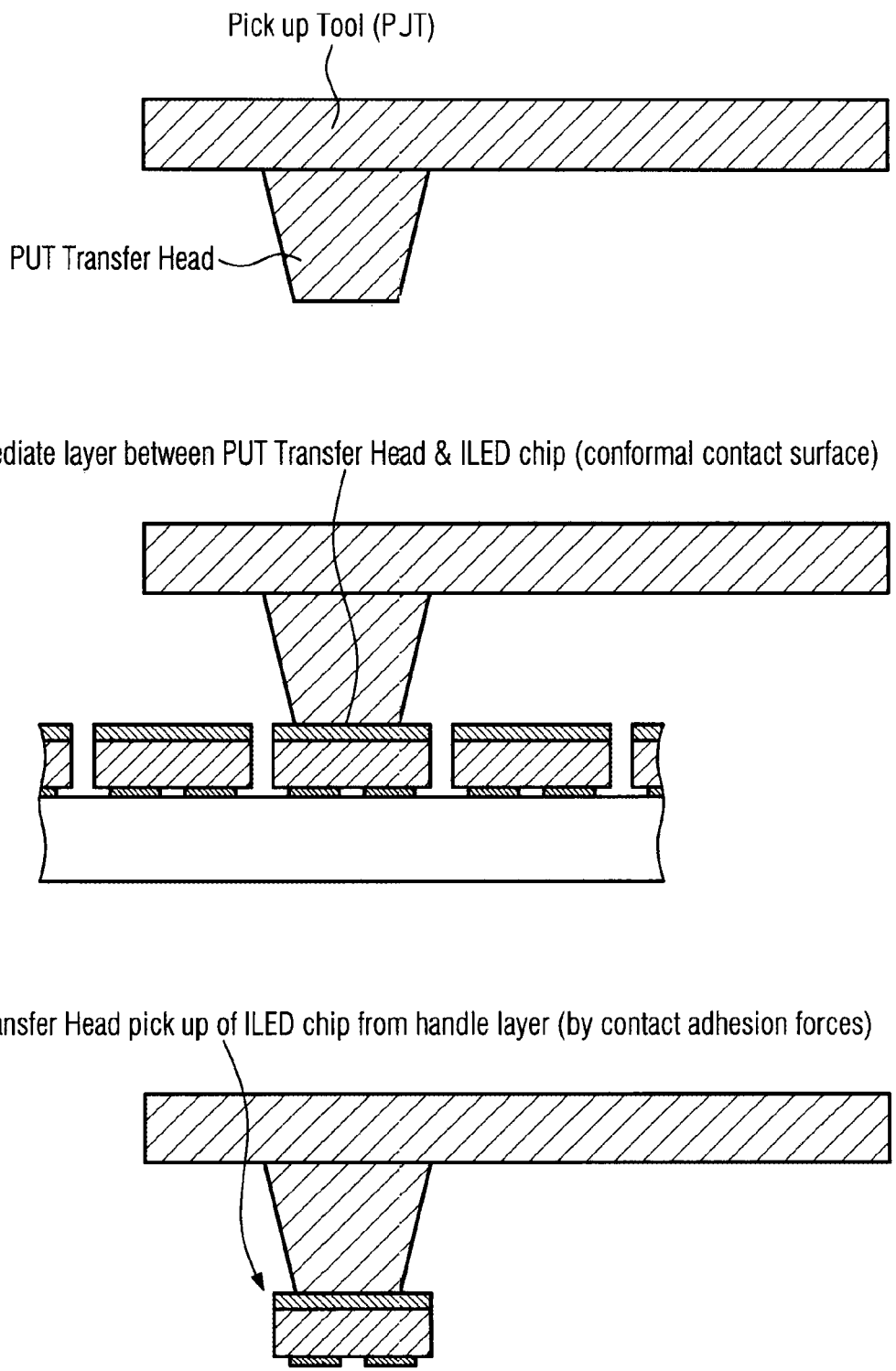
FIG. 27 shows an exemplary assembly process flow.
Figure 28:
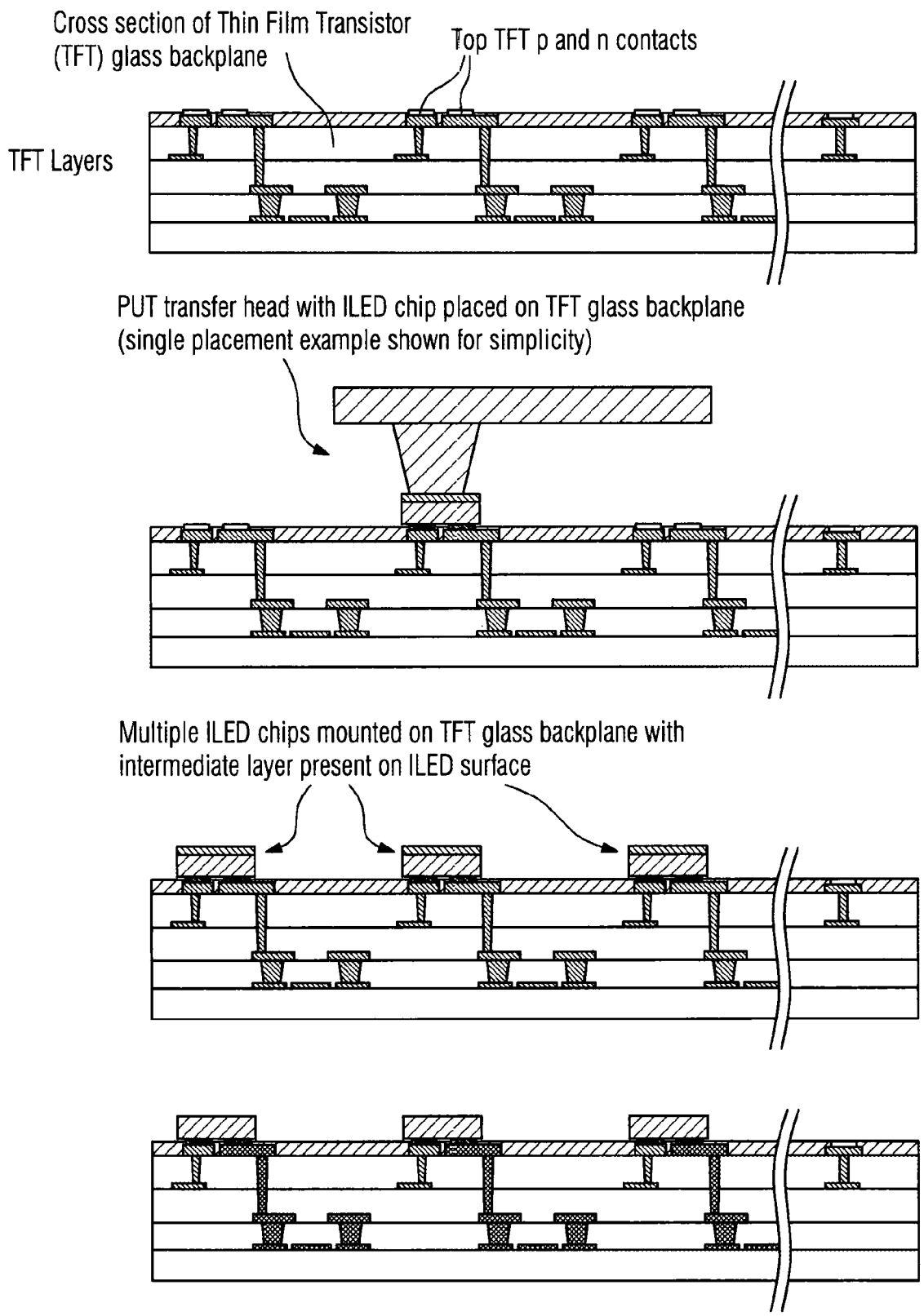
FIG. 28 shows an exemplary assembly process flow.

By way of example, process flows are disclosed in FIG. 26, FIG. 27 and FIG. 28 based on GaN on sapphire material system for blue and green emitting μLEDs. It should be appreciated that this invention is not restricted to this material system nor the sequence of process flow proposed in this disclosure.

The process starts with a GaN on sapphire wafer with epi-layer and/or template plus the substrate which is tailored for ILED chip manufacture and assembly readiness.

The initial step in the process is the manufacture of the μLED device and together with a p and n contact pad. After μLED fabrication the chips are partially singulated on the wafer by a combination of photolithography to define a hard mask and dry etch methods (e.g. DRIE or ICP etch tools) which etches a typically 2 μm wide, 3-5 μm deep trench in the GaN epilayer/template between neighbouring devices. As an example, a SiOx hard mask is deposited and patterned using deep UV resist & photolith tools to transfer the defined pattern into the SiOx using CF4/CHF3 ICP etch chemistry. This is followed by a second chlorine based etch chemistry to etch the GaN. The hard mask is left on the devices for isolation purposes.

After the partial singulation, a mechanical layer is applied to the top surface which acts as a handle layer for subsequent processing steps. Once the handle layer is applied a laser lift-off process is applied which removes the sapphire substrate using a laser beam. Laser lift-off processing is a technique to detach the sapphire substrate from the GaN epilayers using excimer laser photons. The technology is of interest for high throughput and superior quality in the manufacture of HB-LEDs (high brightness) and flexible displays.

Once the sapphire substrate is detached the structure is inverted and presented for further thin-film processing. Specifically according to this invention an intermediate layer is applied to the emitting surface of the μLED chip; i.e. surface 110 in FIG. 1. The chip after LLO process is now fully singulated with the substrate removed and mounted to the handle layer.

The intermediate layer may comprise of a two layer structure consisting first of a sacrificial layer such as a resist which is deposited on the emitting surface. A second conformal (or deformable) layer such as an elastomer is then applied on top of the sacrificial layer. The intermediate layer may be removed in the trenches between neighbouring devices in order to ensure the devices remained separate. A method for doing this includes a photolithography step to define and hard mask followed by a dry etch step.

The intermediate layer is referred to as being intermediate by location between the ILED chip and the transfer head used to pick up and place the die (semiconductor chips).

The intermediate layer is conformal and is a continuous layer across the surface of the μLED chip having a substantially uniform thickness. Alternatively, the intermediate layer can be patterned with microstructures which facilitate the pick up, transfer and/or release using a non-conformal transfer head. The intermediate layer is patterned such that the intermediate layer is patterned directly over the ILED chip so that the devices remain separated.

The transfer head or pick up tool (PUT) transfer head is a flat non-elastomeric head which when applied to the conformal intermediate layer on the μLED device resulting in a conformal contact which enables the chip to be picked up. The pick-up head maybe made from plastic, glass or silicon with a dimple protruding for each ILED chip to be picked up Die that are picked up are directly transferred to and bonded to the TFT pads of the glass panel. Once placed and/or bonded, the pick up head can be removed from the conformal ILED chip using a suitable release mechanism. Mechanisms to release the PUT transfer head from the intermediate layer include 1) pull to generate sufficient peel strength to detach, 2). switchable adhesives surfaces on the PUT transfer head where the adhesive is switched by the application of an external parameter (examples include UV radiation, temperature & pressure) 3). Microstructures on the intermediate layer which can control the adhesion forces between the transfer head and the intermediate layer.

After assembly the intermediate layer can be removed by etching or removal of the sacrificial layer which is a release layer which effectively lift-offs the elastomer layer from the ILED chip.

In other embodiments of this invention, it maybe acceptable or desirable to leave the elastomeric layer on the chip. In this case the intermediate layer need only be a single layer without the underlying sacrificial layer.

The integration of the elastomeric layer with the ILED chips provides a significant benefit for display manufacture. The ability to selectively pick ILED devices represents a significant challenge. Current approaches focus on the selective addressing at the PUT. In the disclosed exemplary methods and apparatus, the material that enables the pick (i.e. the adhesive layer) is on the individual chips. As such this layer can be selectively modified to stop the pick of non-function devices. This could be achieved using a number of techniques. In an exemplary embodiment, a Digital Micro-mirror Device (DMD) can be used to scan a laser beam across the surface of the ILED wafer. This laser beam is used to selectively damage the elastomeric layer of the ILEDs which are not functioning. This would prevent the devices from binding to the PUT and from being picked. The ability to provide a wafer in which no non-functioning devices can be picked results in a great simplification of the assembly process.

This method facilitates the assembly of μLED chips in predetermined positions to manufacture an ILED image generator, see FIG. 28 which is an exemplary cross section through an ILED display. The die is referred to as a display subpixel and consists of single emitter per chip with p and n electrodes formed on the same side as the mesa. The light output is in the opposite direction and through the epilayer of the ILED device. FIG. 28 is a simple concept illustration of an ILED Display. R, G and B ILED's are assembled onto a TFT glass panel substrate. Electrical tracks connects to the μLED with the electrode typically to the p-contact of the µLED and a separate electrode or ground to the n-contact—facilitating two contacts down approach as shown in this Figure. Further assembly of critical element of the full stack for an ILED image generator is not included in this disclosure but is assumed for an ILED display product. These include touch screen sensors, polarisers, glass cover etc.

A computer program may be configured to provide any of the above described methods. The computer program may be provided on a computer readable medium. The computer program may be a computer program product. The product may comprise a non-transitory computer usable storage medium. The computer program product may have computer-readable program code embodied in the medium configured to perform the method. The computer program product may be configured to cause at least one processor to perform some or all of the method.

Various methods and apparatus are described herein with reference to block diagrams or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

Computer program instructions may also be stored in a computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-ray).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks.

Accordingly, the invention may be embodied in hardware and/or in software (including firmware, resident software, micro-code, etc.) that runs on a processor, which may collectively be referred to as "circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated.

The skilled person will be able to envisage other embodiments without departing from the scope of the appended claims.

The invention claimed is:

1. A method for manufacturing a display, comprising:
   depositing a non-conductive underfill on a thin film transistor (TFT) layer of a substrate of the display;
   placing a first light emitting diode (LED) on the non-conductive underfill;
   heating the non-conductive underfill at a first temperature to adhere the first semiconductor device to the TFT layer;
   subsequent to adhering the first LED to the TFT layer, placing a second LED on the non-conductive underfill; and
   heating the non-conductive underfill at a second temperature to bond contacts of the first and second LEDs to the TFT layer, the second temperature being higher than the first temperature.

2. The method of claim 1, wherein the non-conductive underfill is a B-stage epoxy having a complex viscosity as a function of temperature.

3. The method of claim 1, wherein the non-conductive underfill is deposited on the TFT layer at less than 100° C., the first temperature is between 100° C. and 200° C., and the second temperature is greater than 300° C.

4. The method of claim 1, wherein heating the non-conductive underfill at the first temperature squeezes excess underfill material from an interface between the first LED and the TFT layer such that a contact of the first LED is in contact with a contact of the TFT layer.

5. The method of claim 1, wherein heating the non-conductive underfill at the first temperature removes native oxide on a copper contact of the TFT layer or the first LED.

6. The method of claim 1, wherein heating the non-conductive underfill at the second temperature includes performing a thermocompression bonding process that causes reflow of the contacts of the first and second LEDs.

7. The method of claim 6, wherein the performing the thermocompression building processing includes applying a pressure on the first and second LEDS with a rotable thermocompression bonding head.

8. The method of claim 1, wherein the non-conductive underfill distributes thermal expansion mismatch between the first and second LEDs and the TFT layer when the non-conductive underfill is heated at the second temperature to bond the contacts of the first and second LEDs to the TFT layer.

9. The method of claim 1, wherein the non-conductive underfill reduces stress in bonds between the contacts of the first and second LEDs and the TFT layer when the non-conductive underfill is heated at the second temperature to bond the contacts of the first and second LEDs to the TFT layer.

10. The method of claim 1, wherein placing the first LED on the non-conductive underfill includes:
   attaching the first LED to a pick-up tool; and
   placing the first LED on the non-conductive underfill with the pick-up tool, wherein heating the non-conductive underfill at the first temperature to adhere the first semiconductor device to the TFT layer facilitates release of the first LED from the pick-up tool.

11. The method of claim 1, further comprising subsequent to adhering the first LED to the TFT layer and prior to placing a second LED on the non-conductive underfill, testing the first LED.

12. The method of claim 1, where the first and second LEDs are bonded to the TFT layer to provide a sub-pixel of the display.

13. The method of claim 1, wherein heating the non-conductive underfill at the first temperature partially cures the non-conductive underfill and heating the non-conductive underfill at the second temperature fully cures the non-conductive underfill.

14. A display manufactured by a process, comprising:
   depositing a non-conductive underfill on a thin film transistor (TFT) layer of a substrate of the display;
   placing a first light emitting diode (LED) on the non-conductive underfill;
   heating the non-conductive underfill at a first temperature to adhere the first semiconductor device to the TFT layer;
   subsequent to adhering the first LED to the TFT layer, placing a second LED on the non-conductive underfill; and
   heating the non-conductive underfill at a second temperature to bond contacts of the first and second LEDs to the TFT layer, the second temperature being higher than the first temperature.

15. The display of claim 14, wherein the non-conductive underfill is a B-stage epoxy having a complex viscosity as a function of temperature.

16. The display of claim 14, wherein the non-conductive underfill distributes thermal expansion mismatch between the first and second LEDs and the TFT layer when the non-conductive underfill is heated at the second temperature to bond the contacts of the first and second LEDs to the TFT layer.

* * * * *

UNITED STATES PATENT AND TRADEMARK OFFICE
CERTIFICATE OF CORRECTION

PATENT NO. : 10,600,823 B2
APPLICATION NO. : 15/918985
DATED : March 24, 2020
INVENTOR(S) : Padraig Hughes et al.

It is certified that error appears in the above-identified patent and that said Letters Patent is hereby corrected as shown below:

In the Claims

Column 30, Line 57, Claim 7, delete "LEDS" and insert -- LEDs --.

Column 30, Line 57, Claim 7, delete "rotable" and insert -- rotatable --.

Signed and Sealed this
Tenth Day of November, 2020

Andrei Iancu
*Director of the United States Patent and Trademark Office*